US010219395B2

(12) United States Patent
Tajima et al.

(10) Patent No.: US 10,219,395 B2
(45) Date of Patent: Feb. 26, 2019

(54) POWER STORAGE UNIT AND ELECTRONIC DEVICE INCLUDING THE SAME

(71) Applicant: SEMICONDUCTOR ENERGY LABORATORY CO., LTD., Atsugi-shi, Kanagawa-ken (JP)

(72) Inventors: Ryota Tajima, Kanagawa (JP); Yuugo Goto, Kanagawa (JP); Yumiko Yoneda, Kanagawa (JP); Junya Goto, Kanagawa (JP); Takuya Miwa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 90 days.

(21) Appl. No.: 14/555,644

(22) Filed: Nov. 27, 2014

(65) Prior Publication Data

US 2015/0147626 A1 May 28, 2015

(30) Foreign Application Priority Data

Nov. 28, 2013 (JP) .................................. 2013-246468

(51) Int. Cl.
*H01M 10/058* (2010.01)
*H05K 5/00* (2006.01)
(Continued)

(52) U.S. Cl.
CPC ........ *H05K 5/0086* (2013.01); *H01M 2/0277* (2013.01); *H01M 2/0285* (2013.01); (Continued)

(58) Field of Classification Search
CPC ............ H05K 5/0086; H01M 10/0463; H01M 2/0277; H01M 2/1653; H01M 2/18; (Continued)

(56) References Cited

U.S. PATENT DOCUMENTS 6,743,546 B1 * 6/2004 Kaneda ................. H01M 2/021
429/127
8,450,007 B2 5/2013 Enomoto et al.
(Continued)

FOREIGN PATENT DOCUMENTS

CN 101640282 A 2/2010
CN 102959760 A 3/2013
(Continued)

OTHER PUBLICATIONS

Machine translation of JP 2008-269819, retrieved from <https://dossier1.j-platpat.inpit.go.jp/tri/all/odse/ODSE_GM101_Top.action> on Apr. 15, 2016.*
(Continued)

*Primary Examiner* — Cynthia K Walls
(74) *Attorney, Agent, or Firm* — Nixon Peabody LLP; Jeffrey L. Costellia

(57) ABSTRACT

To provide a power storage unit having a structure which is unlikely to break down by change in shape, such as bending. An electrode plate is covered with a sheet of an insulator which is folded in two. The sheet is preferably processed into a bag-like shape or an envelope-like shape by bonding overlapping portions of the sheet in the periphery of the electrode plate. The electrode plate and the sheet are fixed to an exterior body. In the case where the shape of the exterior body is changed by bending or the like, the electrode plate and the sheet can slide together in the exterior body. Thus, stress on the electrode plate due to bending can be relieved.

30 Claims, 21 Drawing Sheets

(51) Int. Cl.
  *H01M 2/02* (2006.01)
  *H01M 2/16* (2006.01)
  *H01M 2/18* (2006.01)
  *H01M 10/04* (2006.01)
  *H01M 2/06* (2006.01)
  *H01M 2/26* (2006.01)
  *H01M 4/58* (2010.01)
  *H01M 10/052* (2010.01)
  *H01M 10/0585* (2010.01)

(52) U.S. Cl.
  CPC ....... *H01M 2/0287* (2013.01); *H01M 2/1653* (2013.01); *H01M 2/18* (2013.01); *H01M 10/0463* (2013.01); *H01M 2/06* (2013.01); *H01M 2/162* (2013.01); *H01M 2/1613* (2013.01); *H01M 2/1626* (2013.01); *H01M 2/266* (2013.01); *H01M 4/58* (2013.01); *H01M 10/052* (2013.01); *H01M 10/0585* (2013.01); *H01M 2220/20* (2013.01); *H01M 2220/30* (2013.01); *Y02E 60/122* (2013.01); *Y02E 60/13* (2013.01)

(58) Field of Classification Search
  CPC ............. H01M 2/0287; H01M 2/0285; H01M 2220/20; H01M 10/052; H01M 2/162; H01M 2/06; H01M 2/1626; H01M 10/0585; Y02E 60/122
  See application file for complete search history.

(56) References Cited

U.S. PATENT DOCUMENTS

| | | | |
|---|---|---|---|
| 8,785,030 B2 | 7/2014 | Ueda | |
| 8,929,085 B2 | 1/2015 | Franklin et al. | |
| 2003/0027045 A1* | 2/2003 | Morigaki | H01M 4/622 429/217 |
| 2005/0088365 A1 | 4/2005 | Yamazaki et al. | |
| 2009/0186270 A1* | 7/2009 | Harada | H01M 2/0267 429/185 |
| 2010/0028769 A1 | 2/2010 | Enomoto et al. | |
| 2010/0081057 A1 | 4/2010 | Liu et al. | |
| 2010/0301279 A1 | 12/2010 | Nesper et al. | |
| 2010/0303706 A1 | 12/2010 | Wallace et al. | |
| 2011/0121240 A1 | 5/2011 | Amine et al. | |
| 2011/0227000 A1 | 9/2011 | Ruoff et al. | |
| 2011/0287341 A1 | 11/2011 | Inoue et al. | |
| 2011/0294009 A1 | 12/2011 | Kawakami et al. | |
| 2012/0002349 A1 | 1/2012 | Ito et al. | |
| 2012/0308891 A1 | 12/2012 | Todoroki et al. | |
| 2013/0004825 A1* | 1/2013 | Kogure | H01M 2/06 429/136 |
| 2013/0101884 A1* | 4/2013 | Ueda | H01M 10/052 429/127 |
| 2013/0224562 A1 | 8/2013 | Momo | |
| 2015/0022957 A1 | 1/2015 | Hiroki et al. | |

FOREIGN PATENT DOCUMENTS

| | | | |
|---|---|---|---|
| JP | 09-213377 A | 8/1997 | |
| JP | 2000-173559 A | 6/2000 | |
| JP | 2002-208442 A | 7/2002 | |
| JP | 2005-157317 A | 6/2005 | |
| JP | 2007-123081 A | 5/2007 | |
| JP | 2008-091100 A | 4/2008 | |
| JP | 2008-130360 A | 6/2008 | |
| JP | 2008-269819 A | 11/2008 | |
| JP | 2009-272161 A | 11/2009 | |
| JP | 2010-033922 A | 2/2010 | |
| JP | 2010-287703 A | 12/2010 | |
| JP | 2011-500488 | 1/2011 | |
| JP | 2011-129378 A | 6/2011 | |
| JP | 2012-009418 A | 1/2012 | |
| JP | 2012-142153 A | 7/2012 | |
| JP | 2013-211262 A | 10/2013 | |
| KR | 2010-0013279 A | 2/2010 | |
| WO | WO-2009/131180 | 10/2009 | |
| WO | WO-2012/140709 | 10/2012 | |
| WO | WO 2012/140709 | * 10/2012 | ........ H01M 10/0436 |
| WO | WO-2012/165358 | 12/2012 | |

OTHER PUBLICATIONS

International Search Report (Application No. PCT/IB2014/066223) dated Mar. 31, 2015.
Written Opinion (Application No. PCT/IB2014/066223) dated Mar. 31, 2015.
Chinese Office Action (Application No. 201480065065.2) dated Apr. 4, 2018.

* cited by examiner

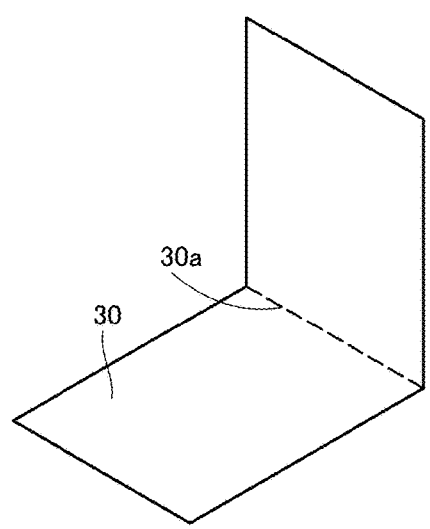
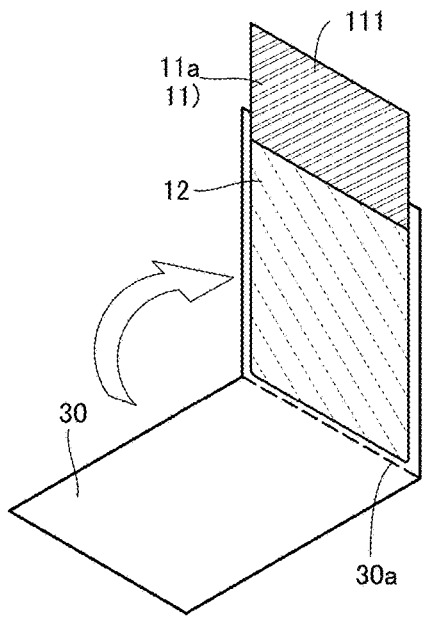
FIG. 9A    FIG. 9B
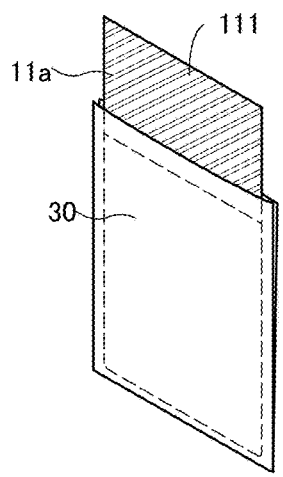
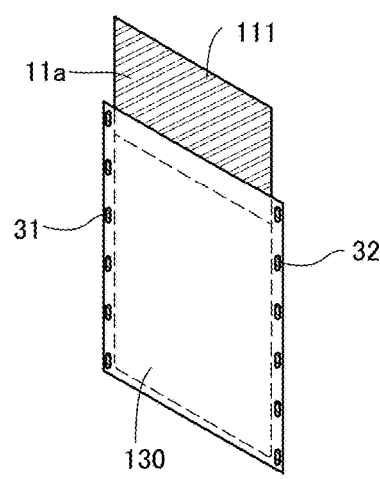
FIG. 9C    FIG. 9D

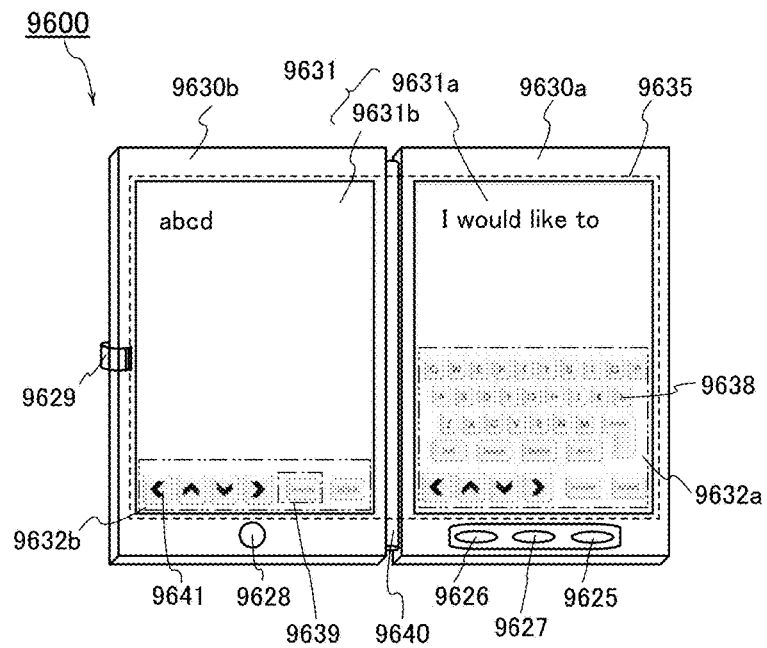
FIG 21A
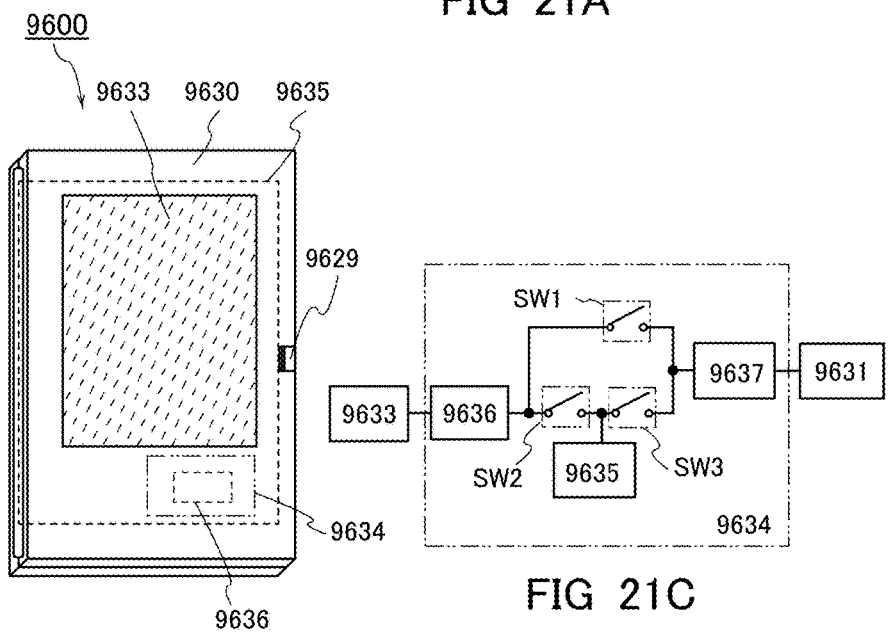
FIG 21B
FIG 21C

POWER STORAGE UNIT AND ELECTRONIC DEVICE INCLUDING THE SAME

TECHNICAL FIELD

The present invention relates to an object, a method, or a manufacturing method. The present invention relates to a process, a machine, manufacture, or a composition of matter. For example, one embodiment of the present invention relates to a power storage unit, a manufacturing method thereof, or the like. For example, one embodiment of the present invention relates to a power storage unit, a semiconductor device, a display device, a light-emitting device, a memory device, a driving method thereof, a manufacturing method thereof, or the like.

BACKGROUND ART

A variety of power storage units such as lithium-ion secondary batteries, lithium-ion capacitors, and air batteries have been actively developed. In particular, demand for lithium-ion secondary batteries with high output and high energy density (see Patent Document 1, for example) has rapidly grown with the development of the semiconductor industry. Power storage units which can be charged and discharged are essential as power supply sources for various electronic devices, e.g., portable information terminals such as cellular phones, smartphones, and laptop personal computers, portable music players, digital cameras, and medical equipment, for today's information society.

Furthermore, flexible display devices used while being mounted on human bodies or curved surfaces, such as display devices mounted on heads, have been proposed in recent years. This has increased demand for flexible power storage units that can be mounted on curved surfaces. A power storage unit which can be curved or bent is described in Patent Document 2.

REFERENCES

Patent Documents

[Patent Document 1] Japanese Published Patent Application No. 2012-009418
[Patent Document 2] Japanese Published Patent Application No. 2013-211262

DISCLOSURE OF INVENTION

An object of one embodiment of the present invention is to provide a novel power storage unit, a novel manufacturing method thereof, or the like. For example, an object of one embodiment of the present invention is to provide a power storage unit which is strong against change in shape, such as bending, or to provide a power storage unit in which a defect hardly occurs.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a power storage unit including a first electrode plate, a second electrode plate, a first sheet formed using an insulator, and an exterior body in which the first electrode plate and the second electrode plate are included. The first electrode plate is covered with the first sheet folded in two, and the first electrode plate and the first sheet are fixed to the exterior body.

One embodiment of the present invention is a power storage unit including a first electrode plate, a second electrode plate, two first sheets formed using an insulator, and an exterior body in which the first electrode plate and the second electrode plate are included. The first electrode plate is covered with the two first sheets, and the first electrode plate and the two first sheets are fixed to the exterior body.

In the above embodiments, the second electrode plate can be fixed to the exterior body. Furthermore, in the above embodiments, the second electrode plate can be covered with the second sheet folded in two which is formed using an insulator, or can be covered with two second sheets, and the second electrode plate and the second sheet can be fixed to the exterior body.

One embodiment of the present invention can provide a novel power storage unit, a novel manufacturing method thereof, or the like. For example, one embodiment of the present invention can provide a power storage unit which is strong against change in shape, such as bending, or provide a power storage unit in which a defect hardly occurs.

Note that the description of these effects does not disturb the existence of other effects. In one embodiment of the present invention, there is no need to obtain all the effects. In one embodiment of the present invention, an object other than the above objects, an effect other than the above effects, and a novel feature will be apparent from the description of the specification and the drawings.

BRIEF DESCRIPTION OF DRAWINGS

FIGS. 9A to 9D show a structural example of a separator and a manufacturing example of a current collector.

FIGS. 21A to 21C show a structural example of an electronic device.

BEST MODE FOR CARRYING OUT THE INVENTION

In this specification, a power storage unit is a collective term describing units and devices having a power storage function. Examples of the power storage unit include a battery, a primary battery, a secondary battery, a lithium-ion secondary battery, a lithium-air secondary battery, a capacitor, and a lithium-ion capacitor. Furthermore, an electrochemical device is a collective term describing devices that can function using a power storage unit, a conductive layer, a resistor, a capacitor, and the like. In addition, an electronic device, an electrical appliance, a mechanical device, and the like each include a power storage unit according to one embodiment of the present invention in some cases.

Hereinafter, embodiments of the present invention will be described in detail with reference to the accompanying drawings. However, embodiments of the present invention are not limited to the following description. It will be readily understood by those skilled in the art that modes and details of the present invention can be changed in various ways without departing from the spirit and scope of the present invention. Therefore, embodiments of the present invention should not be construed as being limited to the description of the embodiments below.

A plurality of embodiments of the present invention are described below. Any of the embodiments can be combined as appropriate. In addition, in the case where structural examples are given in one embodiment, any of the structure examples can be combined as appropriate.

A power storage unit of one embodiment of the present invention includes a positive electrode and a negative electrode. The positive electrode and the negative electrode each include one or more electrode plates (positive electrode plates and negative electrode plates) having a sheet-like shape or a flat-plate-like shape. To prevent the occurrence of a short circuit, both surfaces of at least one of two adjacent electrode plates are covered with a sheet (also referred to as a film) made of an insulator. In the following description, a sheet covering the electrode plate is referred to as a "separator" in some cases.

Embodiment 1

In this embodiment, structural examples of a power storage unit, an example of a manufacturing method thereof, and the like are described.

<<Structural Example 1 of Power Storage Unit>>

A structural example of a power storage unit, an example of a manufacturing method thereof, and the like are described with reference to FIG. 1, FIG. 2, FIG. 3, FIG. 4, FIG. 5, FIGS. 6A to 6C, FIGS. 7A to 7C, FIGS. 8A to 8C, FIGS. 9A to 9D, FIGS. 10A and 10B, FIGS. 11A and 11B, FIGS. 12A to 12C, FIGS. 13A and 13B, FIG. 14, FIGS. 15A to 15C, and FIGS. 16A and 16B.

Figure 1:
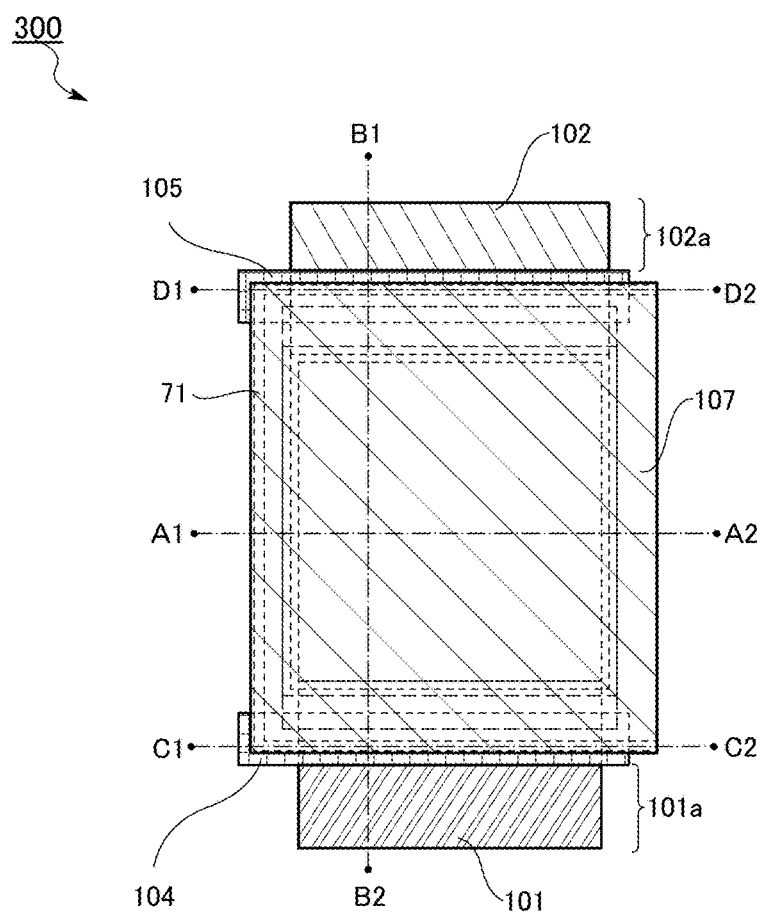
FIG. 1 is a plan view showing a structural example of a power storage unit.
Figure 2:
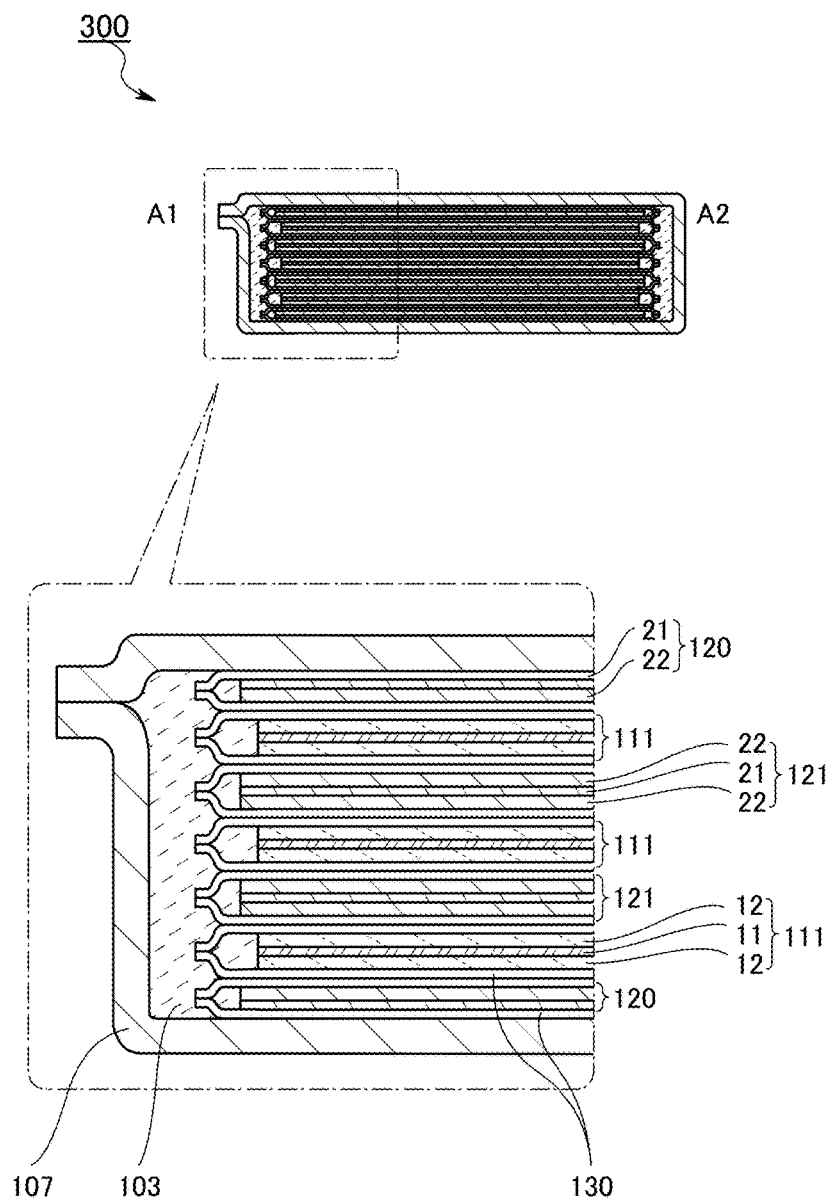
FIG. 2 is a cross-sectional view of FIG. 1.
Figure 3:
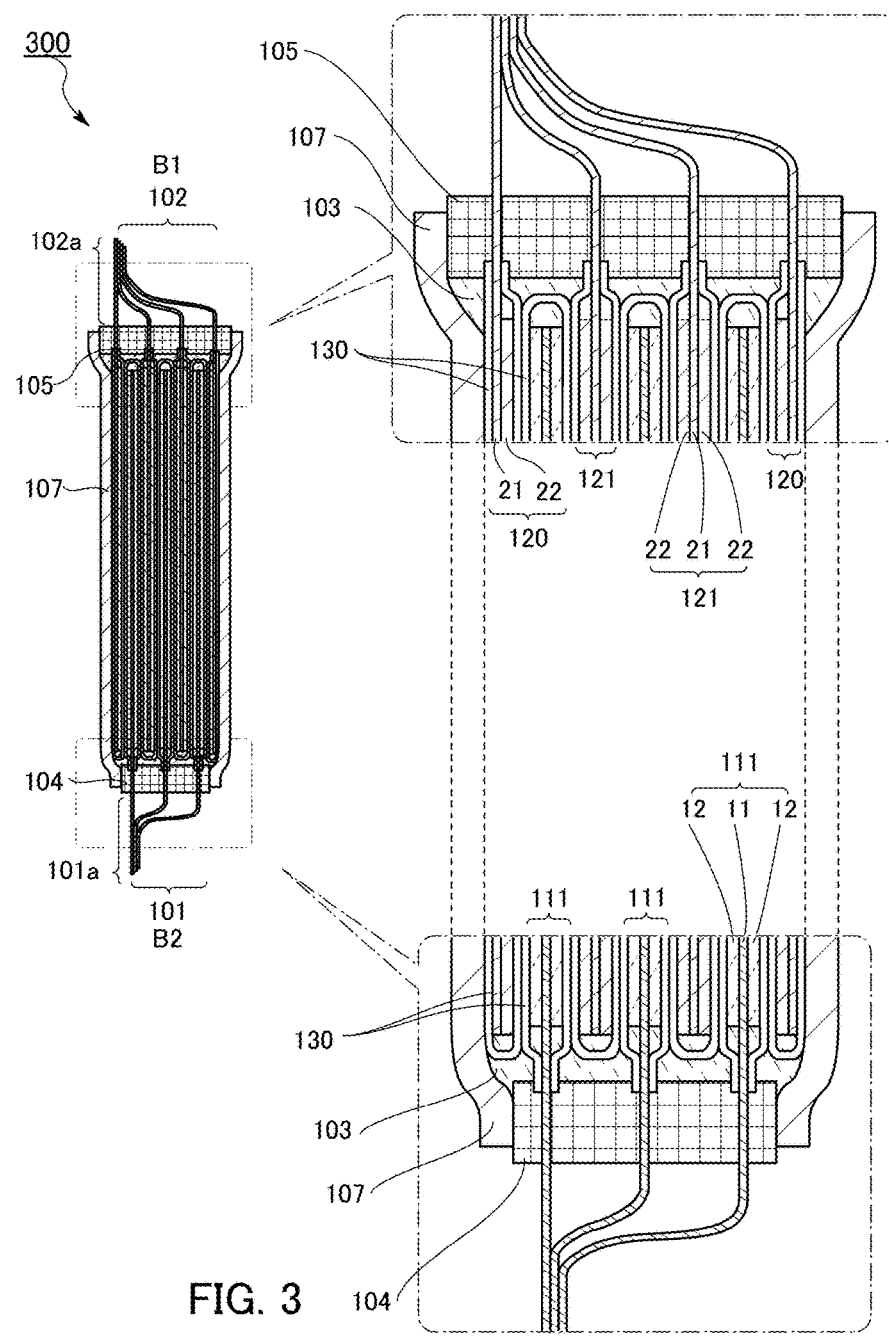
FIG. 3 is a cross-sectional view of FIG. 1.
Figure 4:
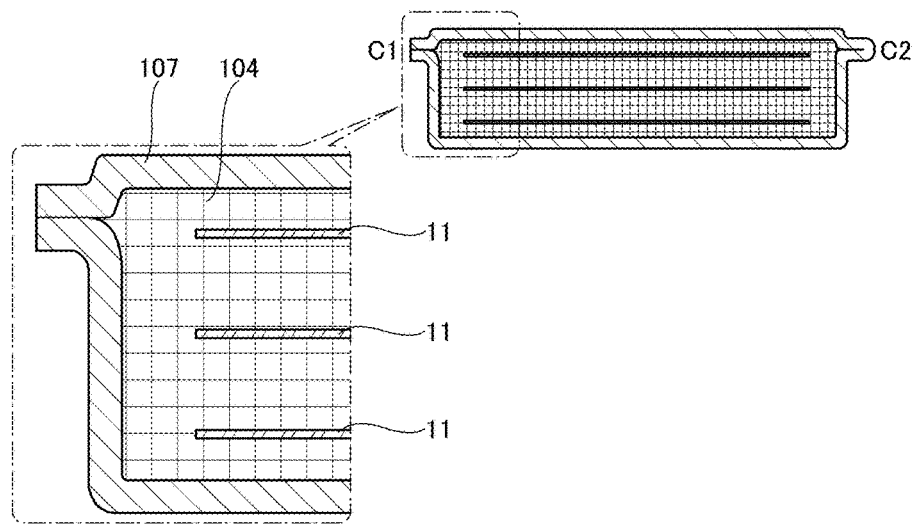
FIG. 4 is a cross-sectional view of FIG. 1.
Figure 5:
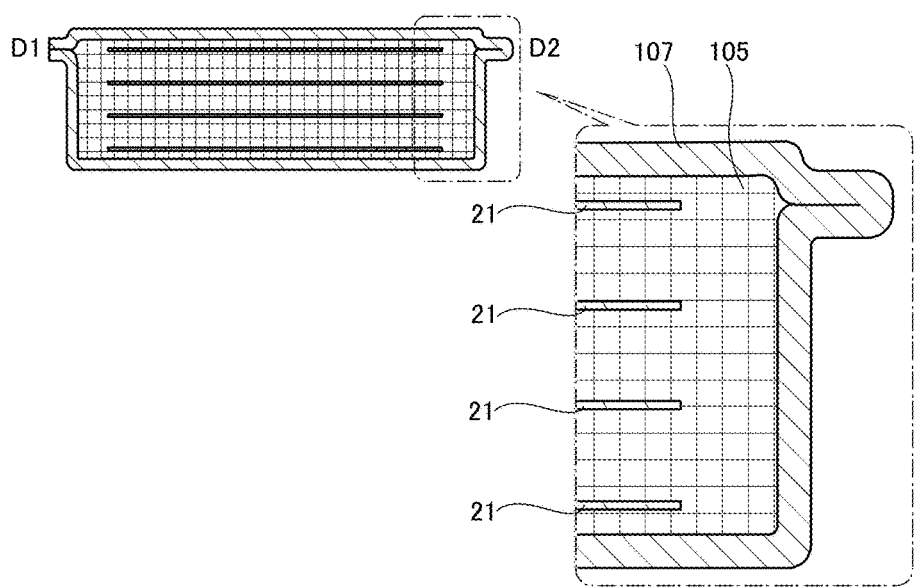
FIG. 5 is a cross-sectional view of FIG. 1.

FIG. 1 is a top view showing the structural example of the power storage unit. FIG. 2, FIG. 3, FIG. 4, and FIG. 5 are cross-sectional views of FIG. 1. FIG. 2 is a cross-sectional view along the line A1-A2. FIG. 3 is a cross-sectional view along the line B1-B2. FIG. 4 is a cross-sectional view along the line C1-C2. FIG. 5 is a cross-sectional view along the line D1-D2. Partially enlarged views are also shown in FIG. 2, FIG. 3, FIG. 4, and FIG. 5.

As illustrated in FIG. 1, a power storage unit 300 includes a positive electrode 101, a negative electrode 102, a sealing structure 104, a sealing structure 105, and an exterior body 107. Here, as an example of the power storage unit 300, a structure in which a planar shape of the exterior body 107 is rectangular is described. Note that in some cases, for easy understanding of an embodiment of the present invention, the terms "upper", "lower", "left", "right", "length", "width", and the like are used on the basis of a method of illustration of drawings to which reference is made. For example, the positive electrode 101 and the negative electrode 102 in FIG. 1 can be described as follows: the positive electrode 101 exists on a lower side surface of the exterior body 107, and the negative electrode 102 exists on an upper side surface of the exterior body 107 that faces the lower side surface.

The positive electrode 101 and the negative electrode 102 except for portions (101a and 102a) that serve as terminals of the power storage unit 300 are sealed in the exterior body 107. An electrolyte solution 103 is also sealed in the exterior body 107 (FIG. 2 and FIG. 3). Hereinafter, the portion 101a and the portion 102a are referred to as a "terminal portion 101a" and a "terminal portion 102a", respectively.

As shown in FIG. 1 and FIG. 3, the terminal portion 101a juts from one of the two facing side surfaces (side surfaces on the lower side and the upper side) of the exterior body 107, and the terminal portion 102a juts from the other side surface. The power storage unit 300 is charged and discharged through the terminal portion 101a and the terminal portion 102a. A lead for the positive electrode can be connected to the terminal portion 101a. A lead for the negative electrode can be connected to the terminal portion 102a.

Here, a structure in which the positive electrode 101 includes three positive electrode plates (111) and the negative electrode 102 includes four negative electrode plates (120 and 121) is described as an example of the power storage unit 300 (FIG. 2 and FIG. 3). The positive electrode plate 111 includes a positive electrode current collector 11 and a positive electrode active material layer 12. The negative electrode plate 120 and the negative electrode plate 121 each include a negative electrode current collector 21 and a negative electrode active material layer 22. The terminal portion 101a includes three positive electrode current collectors 11 which are electrically connected to each other. The terminal portion 102a includes four negative electrode current collectors 21 which are electrically connected to each other. Electrical connection between a plurality of positive electrode current collectors 11 and electrical connection between a plurality of negative electrode current collectors 21 can each be established by bonding the current collectors, for example.

Both surfaces of each electrode plate (111, 120, and 121) of the power storage unit 300 are covered with a separator 130. The separator 130 can be formed of one sheet 30 of an insulator folded in two, for example (see FIGS. 9A to 9D). The separator 130 is described later. Here, a structure in which each of the positive electrode plate and the negative electrode plate is covered with the separator 130 is described as an example of the power storage unit 300. It is needless to say that one embodiment of the present invention is not limited thereto. A structure in which one of the positive electrode plate and the negative electrode plate is covered with the separator 130 can be employed.

The exterior body 107 can be formed by folding one film 70 in two, for example (FIGS. 15A to 15C and FIGS. 16A and 16B). A bonding portion 71 for fixing facing portions of the film 70 is formed along three sides (a left side, an upper side, and a lower side) of the exterior body 107 so that the film 70 is formed into a bag-like shape. The exterior body 107 is described later.

The power storage unit 300 includes the sealing structure 104 and the sealing structure 105 which are provided between facing surfaces of the exterior body 107. As shown in FIG. 1 and FIG. 3, the sealing structure 104 is provided in the lower edge of the exterior body 107 so as to fill a space between the positive electrode 101 and the exterior body 107. The sealing structure 105 is provided in the upper edge of the exterior body 107 so as to fill a space between the negative electrode 102 and the exterior body 107. The exterior body 107 is fixed to the sealing structure 104 in a portion of the bonding portion 71 that is formed in the lower edge of the exterior body 107. The exterior body 107 is fixed to the sealing structure 105 in a portion of the bonding portion 71 that is formed in the upper edge of the exterior body 107. FIG. 4 shows a cross-sectional structure of the sealing structure 104 and the positive electrode 101 in the bonding portion 71. FIG. 5 shows a cross-sectional structure of the sealing structure 105 and the negative electrode 102 in the bonding portion 71.

Structural examples of components of the power storage unit 300 and examples of a method for manufacturing the power storage unit 300 are described below with reference to drawings.

<Electrode Plate>

Figures 6A, 6B, 6C:
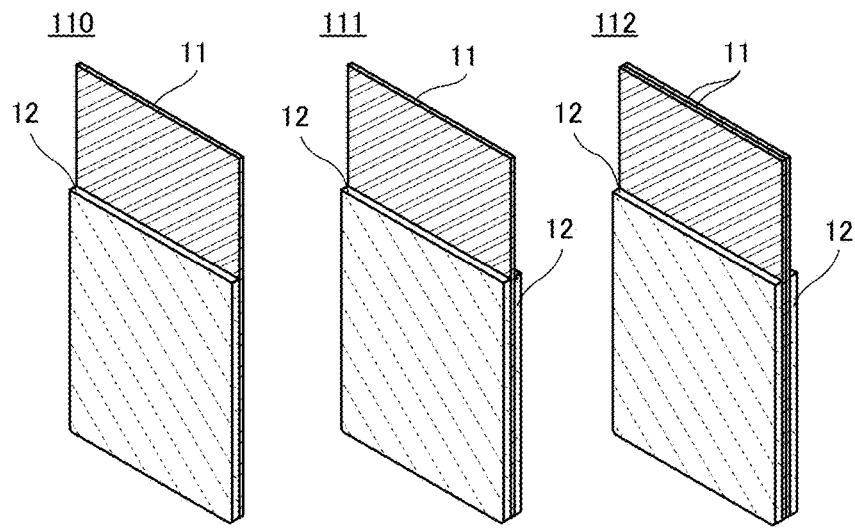
FIGS. 6A to 6C show structural examples of positive electrode plates.
Figures 7A, 7B, 7C:
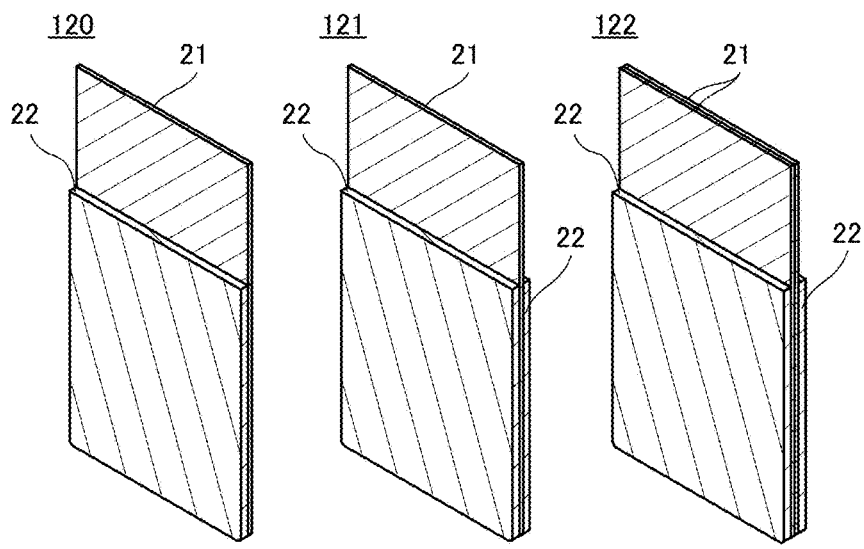
FIGS. 7A to 7C show structural examples of negative electrode plates.
Figure 8A:
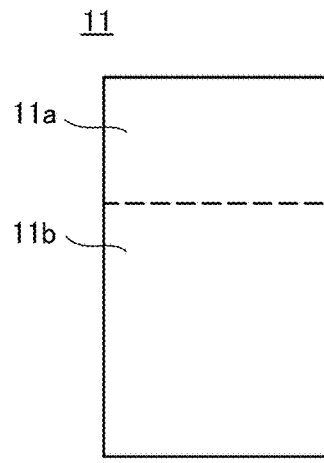
FIGS. 8A to 8C show structural examples of current collectors of a positive electrode plate and a negative electrode plate.
Figure 8B:
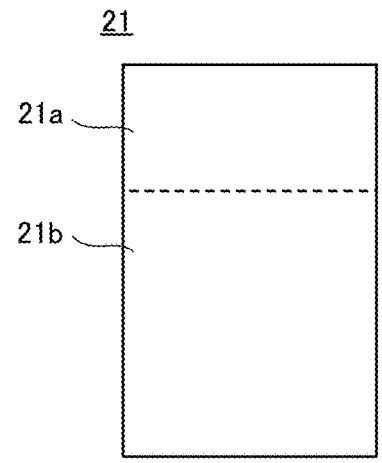
Figure 8C:
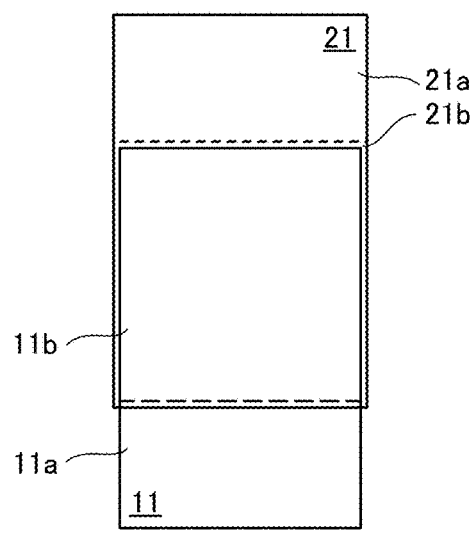

FIGS. 6A to 6C are perspective views showing structural examples of the positive electrode plate. FIGS. 7A to 7C are perspective views showing structural examples of the negative electrode plate. FIGS. 8A to 8C are plan views showing structural examples of the current collectors of the positive electrode plate and the negative electrode plate.

A positive electrode plate 110 includes the positive electrode current collector 11 and the positive electrode active material layer 12 (FIG. 6A). A negative electrode plate 120 includes the negative electrode current collector 21 and the negative electrode active material layer 22 (FIG. 7A). The active material layer is formed on only one surface of each of the positive electrode plate 110 and the negative electrode plate 120.

In the case where the positive electrode and the negative electrode each include two or more electrode plates, an electrode plate in which an active material layer is formed on both surfaces is used. The positive electrode plate 111, a positive electrode plate 112, the negative electrode plate 121, and a negative electrode plate 122 are electrode plates having such a structure. In the positive electrode plate 111, the positive electrode active material layer 12 is formed on both surfaces of one positive electrode current collector 11 (FIG. 6B). In the negative electrode plate 121, the negative electrode active material layer 22 is formed on both surfaces of one negative electrode current collector 21 (FIG. 7B). The positive electrode plate 112 includes two positive electrode current collectors 11 and corresponds to an electrode plate having a structure where two positive electrode plates 110 are placed back to back (FIG. 6C). The negative electrode plate 122 includes two negative electrode current collectors 21 and corresponds to an electrode plate having a structure where two negative electrode plates 120 are placed back to back (FIG. 7C). Here, the positive electrode 101 includes three positive electrode plates 111, whereas the negative electrode 102 includes two negative electrode plates 120 and two negative electrode plates 121.

FIG. 8A is a plan view showing a structural example of the positive electrode current collector 11. FIG. 8B is a plan view showing a structural example of the negative electrode current collector 21. The positive electrode current collector 11 includes two portions (11a and 11b). The positive electrode active material layer 12 is formed on one surface or both surfaces of the portion 11b. The positive electrode active material layer 12 is not formed on the portion 11a. The portion 11a constitutes the terminal portion 101a of the positive electrode 101. The negative electrode current collector 21 similarly includes two portions (21a and 21b). The negative electrode active material layer 22 is formed on one surface or both surfaces of the portion 21b. The negative electrode active material layer 22 is not formed on the portion 21a. The portion 21a constitutes the terminal portion 102a of the negative electrode 102. Here, the portion 11a and the portion 21a are referred to as a "tab 11a" and a "tab 21a", respectively.

FIG. 8C is a plan view of the current collectors (11 and 21) and illustrates a state where the electrode plates (111, 120, and 121) are stacked. The size (length and width) of the portion 21b on which the negative electrode active material layer 22 is formed is made larger than the portion 11b of the positive electrode current collector 11, whereby a peripheral end portion of the positive electrode current collector 11 exists on a surface of the negative electrode current collector 21 when the positive electrode plate 111 and the negative electrode plates (120 and 121) are stacked. Such a structure can relieve the concentration of an electric field at the peripheral end portions of the negative electrode plate 121, and deposition of a whisker in this region is suppressed. Thus, the charge and discharge cycle life of the power storage unit 300 can be increased.

Alternatively, by making the size of the outer shape of the portion 21b smaller than the size of the outer shape of the portion 11b so that the negative electrode active material layer 22 surely faces the positive electrode active material layer 12, the electrode plates (111, 120, and 121) can be stacked so that a peripheral end portion of the negative electrode current collector 21 surely overlaps with the positive electrode current collector 11. Further alternatively, the portion 11b and the portion 21b can have the same size and the electrode plates (111, 120, and 121) can be stacked so that the peripheral end portions of the current collectors correspond to each other.

The electrode plates (111, 120, and 121) may each include a component other than the current collector and the active material layer. Described below are components of the electrode plates (111, 120, and 121), materials thereof, and the like.

[Positive Electrode Current Collector]

The positive electrode current collector 11 can be formed using a material that has high conductivity and is not alloyed with a carrier ion of lithium or the like, such as stainless steel, gold, platinum, aluminum, or titanium, an alloy thereof, or the like. Alternatively, an aluminum alloy to which an element which improves heat resistance, such as silicon, titanium, neodymium, scandium, or molybdenum, is added can be used. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. As the positive electrode current collector 11, a component having a foil-like shape, a plate-like shape, a sheet-like shape, a net-like shape, a punching-metal shape, an expanded-metal shape, or the like can be used as appropriate. The thickness of the positive electrode current collector 11 can be, for example, greater than or equal to 5 μm and less than or equal to 30 μm. The thickness of the positive electrode current collector 11 is preferably greater than or equal to 5 μm and less than or equal to 10 μm because the power storage unit 300 can be thin and lightweight and can be bent easily.

The surface of the positive electrode current collector 11 may be provided with an undercoat made of graphite or the like.

[Positive Electrode Active Material Layer]

The positive electrode active material layer 12 may further include a binder for increasing adhesion of positive electrode active materials, a conductive additive for increasing the conductivity of the positive electrode active material layer 12, and the like in addition to the positive electrode active material.

Examples of the positive electrode active material include a composite oxide with an olivine crystal structure, a composite oxide with a layered rock-salt crystal structure, and a composite oxide with a spinel crystal structure. As the positive electrode active material, a compound such as $LiFeO_2$, $LiCoO_2$, $LiNiO_2$, $LiMn_2O_4$, $V_2O_5$, $Cr_2O_5$, and $MnO_2$ is used.

$LiCoO_2$ is particularly preferable because it has high capacity, stability in the air higher than that of $LiNiO_2$, and thermal stability higher than that of $LiNiO_2$, for example.

It is preferable to add a small amount of lithium nickel oxide ($LiNiO_2$ or $LiNi_{1-x}MO_2$ (M=Co, Al, or the like)) to a compound with a spinel crystal structure which contains manganese such as $LiMn_2O_4$ because the elution of manganese and the decomposition of an electrolyte solution can be suppressed, for example.

Alternatively, a complex material ($LiMPO_4$ (general formula) (M is one or more of Fe(II), Mn(II), Co(II), and Ni(II))) can be used as the positive electrode active material. Typical examples of the general formula $LiMPO_4$ are lithium compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ ($a+b\leq1$, $0<a<1$, and $0<b<1$), $LiFe_cNi_dCo_ePO_4$, $LiFe_cNi_dMn_ePO_4$, $LiNi_cCo_dMn_ePO_4$ ($c+d+e\leq1$, $0<c<1$, $0<d<1$, and $0<e<1$), and $LiFe_fNi_gCo_hMn_iPO_4$ ($f+g+h+i\leq1$, $0<f<1$, $0<g<1$, $0<h<1$, and $0<i<1$).

$LiFePO_4$ is particularly preferable because it properly satisfies conditions necessary for the positive electrode active material, such as safety, stability, high capacity density, high potential, and the existence of lithium ions which can be extracted in initial oxidation (charging).

Alternatively, a complex material such as $Li_{(2-j)}MSiO_4$ (general formula) (M is one or more of Fe(II), Mn(II), Co(II), and Ni(II); $0\leq j\leq 2$) may be used as the positive electrode active material. Typical examples of the general formula $Li_{(2-j)}MSiO_4$ are lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ ($k+l\leq1$, $0<k<1$, and $0<l<1$), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ ($m+n+q\leq1$, $0<m<1$, $0<n<1$, and $0<q<1$), and $Li_{(2-j)}Fe_rNi_sCo_tMn_uSiO_4$ ($r+s+t+u\leq1$, $0<r<1$, $0<s<1$, $0<t<1$, and $0<u<1$).

Still alternatively, a nasicon compound expressed by $A_xM_2(XO_4)_3$ (general formula) (A=Li, Na, or Mg, M=Fe, Mn, Ti, V, Nb, or Al, X=S, P, Mo, W, As, or Si) can be used as the positive electrode active material. Examples of the nasicon compound are $Fe_2(MnO_4)_3$, $Fe_2(SO_4)_3$, and $Li_3Fe_2(PO_4)_3$. Still further alternatively, compounds represented by a general formula, $Li_2MPO_4F$, $Li_2MP_2O_7$, and $Li_5MO_4$ (M=Fe or Mn), a perovskite fluoride such as $NaFeF_3$ and $FeF_3$, a metal chalcogenide (a sulfide, a selenide, and a telluride) such as $TiS_2$ and $MoS_2$, an oxide with an inverse spinel crystal structure such as $LiMVO_4$, a vanadium oxide (e.g., $V_2O_5$, $V_6O_{13}$, and $LiV_3O_8$), a manganese oxide, and organic sulfur can be used as the positive electrode active material, for example.

In the case where carrier ions are alkaline-earth metal ions or alkali metal ions other than lithium ions, the positive electrode active material may contain, instead of lithium in the above lithium compound, lithium-containing complex phosphate, lithium-containing complex silicate, or the like, an alkali metal (e.g., sodium or potassium) or an alkaline-earth metal (e.g., calcium, strontium, barium, beryllium, or magnesium). For example, the positive electrode active material may be a layered oxide containing sodium such as $NaFeO_2$ or $Na_{2/3}[Fe_{1/2}Mn_{1/2}]O_2$.

Further alternatively, any of the aforementioned materials may be combined to be used as the positive electrode active material. For example, a solid solution containing any of the aforementioned materials, e.g., a solid solution containing $LiCo_{1/3}Mn_{1/3}Ni_{1/3}O_2$ and $Li_2MnO_3$ may be used.

A carbon layer or an oxide layer such as a zirconium oxide layer may be provided on a surface of the positive electrode active material layer 12. The carbon layer or the oxide layer increases the conductivity of an electrode. The positive electrode active material layer 12 can be coated with the carbon layer by mixing a carbohydrate such as glucose at the time of baking the positive electrode active material.

The average particle diameter of the primary particle of the positive electrode active material layer 12 is preferably greater than or equal to 50 nm and less than or equal to 100 μm.

Examples of the conductive additive include acetylene black (AB), graphite (black lead) particles, carbon nanotubes, graphene, and fullerene.

A network for electron conduction can be formed in the positive electrode active material layer 12 by the conductive additive. The conductive additive also allows maintaining of a path for electric conduction between the positive electrode active materials. The addition of the conductive additive to the positive electrode active material layer 12 increases the electron conductivity of the positive electrode active material layer 12.

Graphene has an excellent electrical characteristic of high conductivity and excellent physical properties of high flexibility and high mechanical strength. Furthermore, graphene can be used as the conductive additive of the negative electrode active material layer 22. The use of graphene as the conductive additive can increase contact points and the contact area of particles of an active material.

As the binder, instead of polyvinylidene fluoride (PVDF) as a typical one, polyimide, polytetrafluoroethylene, polyvinyl chloride, ethylene-propylene-diene polymer, styrene-butadiene rubber, acrylonitrile-butadiene rubber, fluorine rubber, polyvinyl acetate, polymethyl methacrylate, polyethylene, nitrocellulose or the like can be used.

The content of the binder in the positive electrode active material layer 12 is preferably greater than or equal to 1 wt and less than or equal to 10 wt, more preferably greater than or equal to 2 wt and less than or equal to 8 wt, and still more preferably greater than or equal to 3 wt and less than or equal to 5 wt. The content of the conductive additive in the positive electrode active material layer 12 is preferably greater than or equal to 1 wt and less than or equal to 10 wt, more preferably greater than or equal to 1 wt and less than or equal to 5 wt.

[Negative Electrode Current Collector]

The negative electrode current collector 21 can be formed using a material that has high conductivity and is not alloyed with a carrier ion of lithium or the like, such as stainless steel, gold, platinum, zinc, iron, copper, titanium, or tantalum, an alloy thereof, or the like. Alternatively, an aluminum alloy to which an element which improves heat resistance, such as silicon, titanium, neodymium, scandium, and molybdenum, is added can be used. Further alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The negative electrode current collector 21 can have a foil-like shape, a plate-like shape (sheet-like shape), a net-like shape, a punching-metal shape, an expanded-metal shape, or the like as appropriate. The thickness of the negative electrode current collector 21 can be, for example, greater than or equal to 5 μm and less than or equal to 30 μm. The thickness of the negative electrode current collector 21 is preferably greater than or equal to 5 μm and less than or equal to 20 μm because the power storage unit 300 can be thin and lightweight and can be bent easily.

The surface of the negative electrode current collector 21 may be provided with an undercoat using graphite or the like.

[Negative Electrode Active Material Layer]

The negative electrode active material layer 22 may further include a binder for increasing adhesion of negative electrode active materials, a conductive additive for increasing the conductivity of the negative electrode active material layer 22, and the like in addition to the negative electrode active material.

There is no particular limitation on the negative electrode active material as long as it is a material with which lithium can be dissolved and precipitated or a material into/from which lithium ions can be inserted and extracted. Other than a lithium metal or lithium titanate, a carbon-based material generally used in the field of a power storage unit, or an alloy-based material can also be used as the negative electrode active material.

The lithium metal is preferable because of its low redox potential (3.045 V lower than that of a standard hydrogen electrode) and high specific capacity per unit weight and per unit volume (3860 mAh/g and 2062 mAh/cm$^3$).

Examples of the carbon-based material include graphite, graphitizing carbon (soft carbon), non-graphitizing carbon (hard carbon), a carbon nanotube, graphene, carbon black, and the like. Examples of the graphite include artificial graphite such as meso-carbon microbeads (MCMB), coke-based artificial graphite, or pitch-based artificial graphite and natural graphite such as spherical natural graphite. Graphite has a low potential substantially equal to that of a lithium metal (0.1 V to 0.3 V vs. Li/Li$^+$) when lithium ions are inserted into the graphite (when a lithium-graphite intercalation compound is formed). For this reason, a lithium ion battery can have a high operating voltage. In addition, graphite is preferable because of its advantages such as relatively high capacity per unit volume, small volume expansion, low cost, and safety greater than that of a lithium metal.

For the negative electrode active material, an alloy-based material which enables charge-discharge reaction by an alloying reaction and a dealloying reaction with lithium can be used. In the case where lithium ions are carrier ions, the alloy-based material is, for example, a material containing at least one of Al, Si, Ge, Sn, Pb, Sb, Bi, Ag, Zn, Cd, In, Ga, and the like. Such elements have higher capacity than carbon. In particular, silicon has a theoretical capacity of 4200 mAh/g, which is significantly high. For this reason, silicon is preferably used as the negative electrode active material. Examples of the alloy-based material using such elements include $Mg_2Si$, $Mg_2Ge$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, SbSn, and the like.

Alternatively, as the negative electrode active material, oxide such as SiO, SnO, $SnO_2$, titanium dioxide ($TiO_2$), lithium titanium oxide ($Li_4Ti_5O_{12}$), lithium-graphite intercalation compound ($Li_xC_6$), niobium pentoxide ($Nb_2O_5$), tungsten oxide ($WO_2$), molybdenum oxide ($MoO_2$), or the like can be used.

Still alternatively, as the negative electrode active material, $Li_{3-x}M_xN$ (M=Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g and 1890 mAh/cm$^3$).

A nitride containing lithium and a transition metal is preferably used, in which case lithium ions are contained in the negative electrode active material and thus the negative electrode active material can be used in combination with a material for a positive electrode active material which does not contain lithium ions, such as $V_2O_5$ or $Cr_3O_8$. Note that in the case of using a material containing lithium ions as a positive electrode active material, the nitride containing lithium and a transition metal can be used as the negative electrode active material by extracting the lithium ions contained in the positive electrode active material in advance.

Still further alternatively, as the negative electrode active material, a material which causes conversion reaction can be used. For example, a transition metal oxide with which an alloying reaction with lithium is not caused, such as cobalt oxide (CoO), nickel oxide (NiO), or iron oxide (FeO), may be used for the negative electrode active material. Other examples of the material which causes a conversion reaction include oxides such as $Fe_2O_3$, CuO, $Cu_2O$, $RuO_2$, and $Cr_2O_3$, sulfides such as $CoS_{0.89}$, NiS, or CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$. Note that any of the fluorides can be used as the positive electrode active material because of its high potential.

Graphene may be formed on a surface of the negative electrode active material. For example, in the case of using silicon as the negative electrode active material, the volume of silicon is greatly changed due to occlusion and release of carrier ions in charge-discharge cycles. Thus, adhesion between the negative electrode current collector 21 and the negative electrode active material layer 22 is decreased, resulting in degradation of battery characteristics caused by charge and discharge. In view of this, graphene is preferably formed on a surface of the negative electrode active material containing silicon because even when the volume of silicon is changed in charge-discharge cycles, separation between the negative electrode current collector 21 and the negative electrode active material layer 22 can be prevented, which makes it possible to reduce degradation of battery characteristics.

Further, a coating film of oxide or the like may be formed on the surface of the negative electrode active material. A coating film formed by decomposition or the like of an electrolyte solution or the like in charging cannot release electric charges used at the formation, and therefore forms irreversible capacity. In contrast, the film of an oxide or the like provided on the surface of the negative electrode active material in advance can reduce or prevent generation of irreversible capacity.

As the coating film coating the negative electrode active material, an oxide film of any one of niobium, titanium, vanadium, tantalum, tungsten, zirconium, molybdenum, hafnium, chromium, aluminum, and silicon or an oxide film containing any one of these elements and lithium can be used. Such a film is denser than a conventional film formed on a surface of a negative electrode due to a decomposition product of an electrolyte solution.

For example, niobium pentoxide ($Nb_2O_5$) has a low electric conductivity of $10^{-9}$ S/cm and a high insulating property. For this reason, a niobium oxide film inhibits electrochemical decomposition reaction between the negative electrode active material and the electrolyte solution. On the other hand, niobium oxide has a lithium diffusion coefficient of $10^{-9}$ cm$^2$/sec and high lithium ion conductivity. Therefore, niobium oxide can transmit lithium ions. Alternatively, silicon oxide or aluminum oxide may be used.

A sol-gel method can be used to coat the negative electrode active material with the coating film, for example. The sol-gel method is a method for forming a thin film in such a manner that a solution of metal alkoxide, a metal salt, or the like is changed into a gel, which has lost its fluidity, by hydrolysis reaction and polycondensation reaction and the gel is baked. Since a thin film is formed from a liquid phase in the sol-gel method, raw materials can be mixed uniformly on the molecular scale. For this reason, by adding a negative electrode active material such as graphite to a raw material of the metal oxide film which is a solvent, the active material can be easily dispersed into the gel. In such a manner, the coating film can be formed on the surface of the negative electrode active material. A decrease in the capacity of the power storage unit can be prevented by using the coating film.

<Formation of Electrode Plate>

The positive electrode active material layer 12 can be formed by a coating method or the like. For example, a positive electrode active material, a binder, and a conductive additive are mixed to form a positive electrode paste (slurry). The positive electrode paste is applied to both surfaces of foil (e.g., aluminum foil) made of a conductor for forming the positive electrode current collector 11, and drying is performed. The aluminum foil on which the positive electrode active material layer 12 is formed is processed. The processing may be performed using a punching device, for example. Through the above steps, the positive electrode plate 111 can be formed. The negative electrode plates 120 and 121 can be formed in a similar manner. The negative electrode current collector 21 is formed using copper foil, for example. In the case of forming the negative electrode plate 120, a negative electrode paste is applied to one surface of the copper foil. In the case of forming the negative electrode plate 121, the negative electrode paste is applied to both surfaces of the copper foil.

<Separator>

As shown in FIGS. 9A to 9D, the separator 130 can be formed using a sheet 30 which is made of an insulator and is folded in two. As the sheet 30, a sheet formed using a porous insulator such as polypropylene (PP), polyethylene (PE), polybutene, nylon, polyester, polysulfone, polyacrylonitrile, polyvinylidene fluoride, or tetrafluoroethylene can be used. Furthermore, nonwoven fabric formed using fiber made of an insulating material (glass fiber, high-molecular fiber, or cellulose) can be used. The sheet 30 may be a sheet including a stack of a plurality of sheets. A surface of the sheet 30 may be coated with a resin material or the like to increase heat resistance and hydrophilicity thereof. The thickness of the sheet 30 is greater than or equal to 10 μm and less than or equal to 50 μm, for example.

An example of a method for forming the separator 130 that covers the positive electrode plate 111 is described with reference to FIGS. 9A to 9D. A fold 30a is formed in the sheet 30 (FIG. 9A). The positive electrode plate 111 is provided to overlap with the sheet 30 (FIG. 9B). Then, the sheet 30 is folded along the fold 30a, and the positive electrode plate 111 is provided between facing surfaces of the sheet 30 (FIG. 9C). In this way, a state where both surfaces (a top surface and a bottom surface) of the positive electrode plate 111 are covered with the sheet 30 is produced. Here, in order to maintain the state, in regions where the facing surfaces of the sheet 30 directly overlap with each other (i.e., in the left part and the right part of an outer peripheral portion of the positive electrode plate 111), a portion of the sheet 30 is bonded to another portion of the sheet 30. Examples of a method for bonding the portions of the sheet 30 include welding by heating, ultrasonic welding, and adhesion using an adhesive. The bonding method may be selected as appropriate according to materials of the sheet 30, the electrolyte solution 103, and the like.

Through the above-described steps, the separator 130 is completed. The separator 130 can be referred to as the sheet 30 of an insulator having a bag-like shape or an envelope-like shape. Forming bonding portions 31 and 32 allows the separator 130 to be brought into closer contact with the positive electrode plate 111. Thus, the positive electrode plate 111 can be prevented from being shifted from the separator 130. Furthermore, the separator 130 can be prevented from being creased.

Figure 10A:
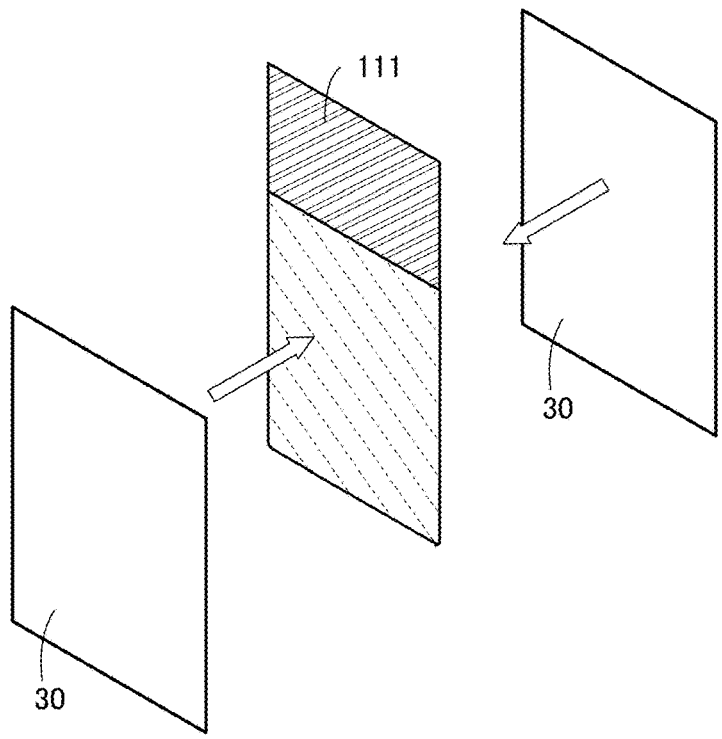
FIGS. 10A and 10B show a structural example of a separator and a manufacturing example of a current collector.
Figure 10B:
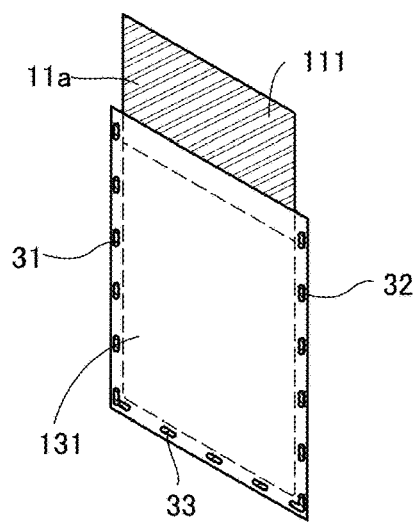

Although the separator in the example shown in FIGS. 9A to 9D is formed of one sheet, the separator can be formed of two sheets. The positive electrode plate 111 is provided between two sheets 30 (FIG. 10A). The two sheets 30 are bonded to each other; thus, a separator 131 is completed (FIG. 10B). In the example shown in FIG. 10B, the bonding portions 31 and 32 are formed in the separator 131 like those formed in the separator 130; furthermore, a bonding portion 33 is formed in a portion corresponding to the fold 30a in the sheet 30 shown in FIG. 9A.

Figure 11A:
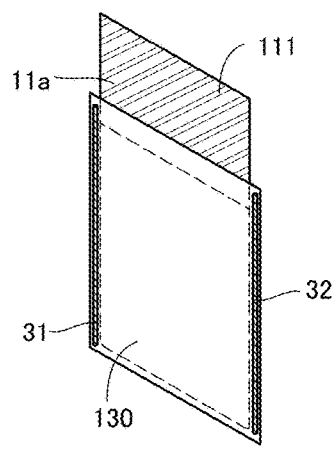
FIGS. 11A and 11B show structural examples of a power storage unit and manufacturing examples thereof.
Figure 11B:
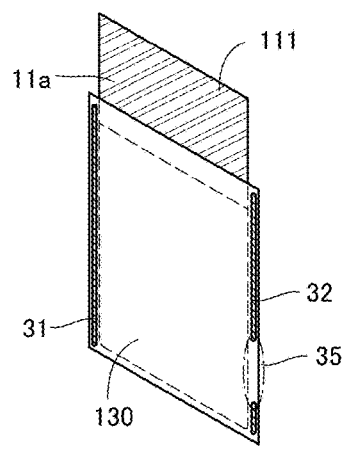

Note that the bonding portions provided to form the sheet 30 into an envelope-like shape (bag-like shape) are not limited to the structures shown in FIG. 9D and FIG. 10B as long as the separators 130 and 131 can be formed so that the positive electrode plate 111 is covered with the one sheet 30 or the two sheets 30. Some structural examples thereof are described below with reference to FIGS. 11A and 11B. For example, the bonding portions 31 and 32 can be formed so that openings are not left in outer edges of the separator 130 which do not overlap with the tab 11a (outer edges on the right side and the left side of the sheet 30) (FIG. 11A). Alternatively, the bonding portions 31 and 32 can be formed so that an opening 35 is provided in a portion of an outer edge of the separator 130 (FIG. 11B).

By covering each of the positive electrode plate and the negative electrode plate with the separator, an effect of preventing a short circuit between the electrode plates is improved. In that case, a sheet of an insulator for forming the separator that covers the positive electrode plate can be made different from a sheet of an insulator for forming the separator that covers the negative electrode plate. For example, the separator that covers the negative electrode plate is formed using nonwoven fabric made of cellulose or the like in order to remove a deposit. The separator that covers the positive electrode plate is formed using a porous resin sheet having a shutdown function. In this way, safety of the power storage unit can be improved.

By covering one of the positive electrode plate and the negative electrode plate with the separator, the power storage unit can be thin and lightweight as compared to the case of covering each of the positive electrode plate and the negative electrode plate with the separator. For example, there is a case where gas is generated in an aging step in which charging and discharging are performed after the power storage unit is manufactured. In that case, the electrode plate which is more likely to generate gas is not covered with the separator in order to perform degassing easily. For example, there is a case where a deposit that might degrade characteristics is easily generated by repetition of charge and discharge of the power storage unit 300 in use. In that case, the electrode plate which is more likely to generate a deposit is covered with the separator in order to prevent a short circuit between the positive electrode and the negative electrode more effectively. For example, in the case of a lithium-ion secondary battery, a whisker of lithium is formed on the negative electrode plate in some cases; therefore, the negative electrode plate is preferably covered with the separator.

<Electrode Stack and Sealing Structure>

Next, the negative electrode plates (120 and 121) and the positive electrode plates (111) are stacked by turns to form an electrode stack including a plurality of electrode plates. In this embodiment, in the electrode stack, a component for forming the sealing structure 104 is provided between adjacent positive electrode plates, and a component for forming the sealing structure 105 is provided between the negative electrode plates. Here, an example in which a fusing tape formed using an insulator is used for the sealing structures 104 and 105 is described.

Figure 12A:
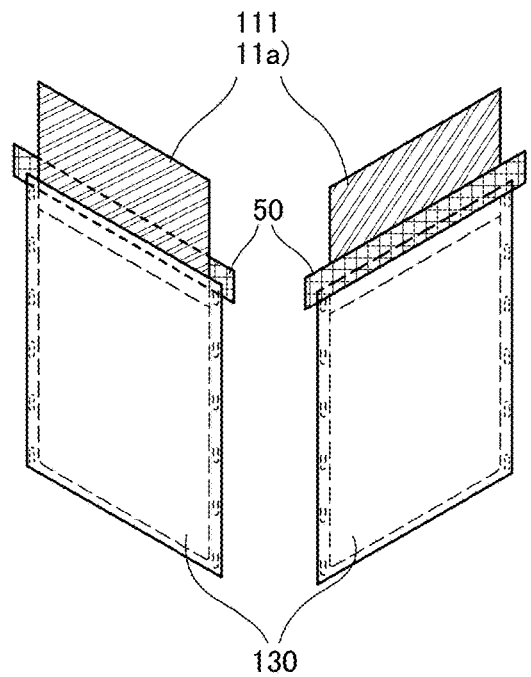
FIGS. 12A to 12C show structural examples of a power storage unit and manufacturing examples thereof.
Figures 12B, 12C:
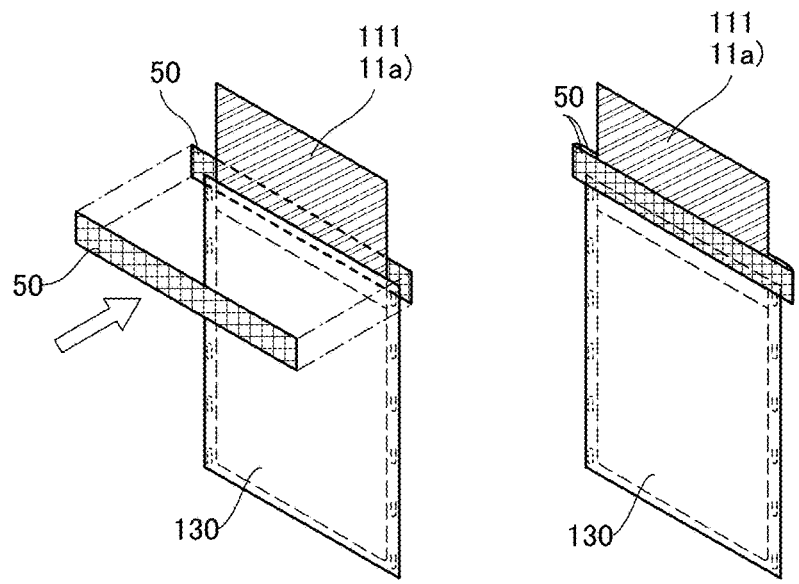

Before the electrode plates (111, 120, and 121) are stacked, the fusing tape is attached to each electrode plate. Here, a method of attaching the fusing tape to the positive electrode plate 111 is described, for example. The fusing tape is attached to each of the negative electrode plates (120 and 121) in a similar manner. As shown in FIG. 12A, a fusing tape 50 is attached to the positive electrode plate 111 so as to overlap with an open edge of the separator 130 having an envelope-like shape. The fusing tape 50 is attached to the tab 11a and the separator 130. It is preferable that the positive electrode active material layer 12 be not formed on the positive electrode plate 111 in a portion which overlaps with the fusing tape 50. FIG. 12A shows an example in which the fusing tape 50 is attached to one surface of the positive electrode plate 111. In FIG. 12A, both surfaces of the positive electrode plate 111 are shown. Alternatively, as shown in FIGS. 12B and 12C, the fusing tape 50 can be attached to the both surfaces of the positive electrode plate 111. Further alternatively, two or more layers of the fusing tape 50 can be attached to one surface or both surfaces of the positive electrode plate 111. A method of attaching the fusing tape 50 can be determined in accordance with the thicknesses of the positive electrode plate 111, the sheet 30, and the fusing tape 50. The fusing tape is attached to both surfaces of each of the top layer and the bottom layer of the electrode stack, whereby a space formed between the exterior body and the tab of the electrode plate can be filled with the sealing structure.

Figure 13A:
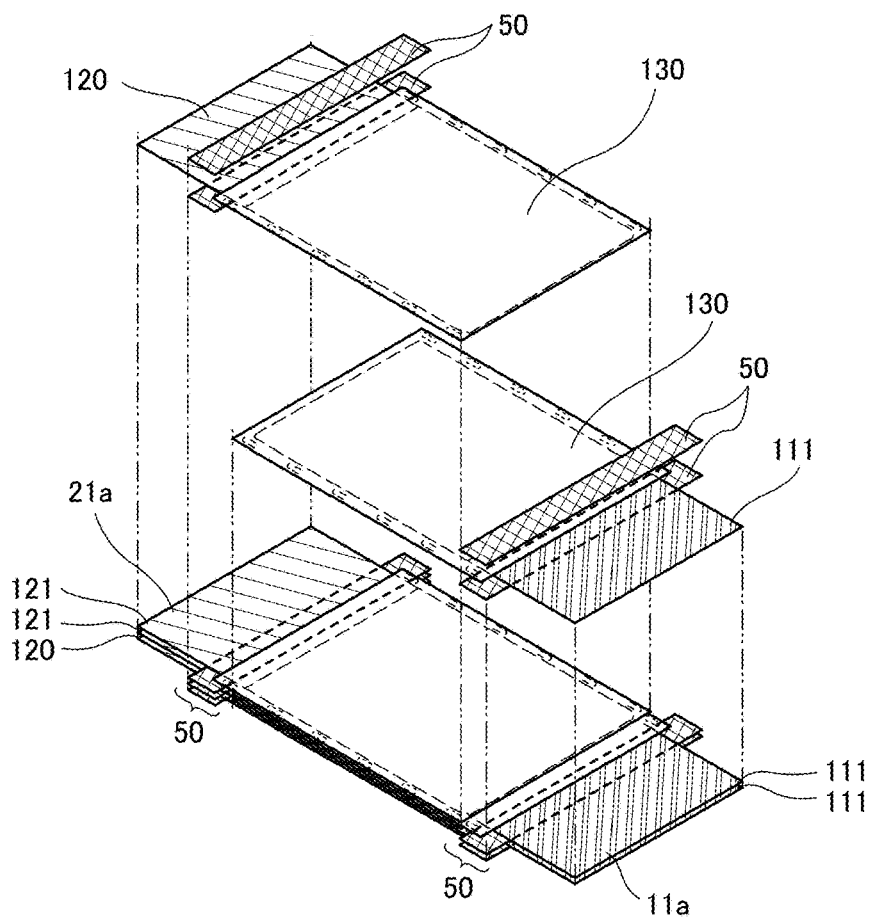
FIGS. 13A and 13B show a structural example of a power storage unit and a manufacturing example thereof.
Figure 13B:
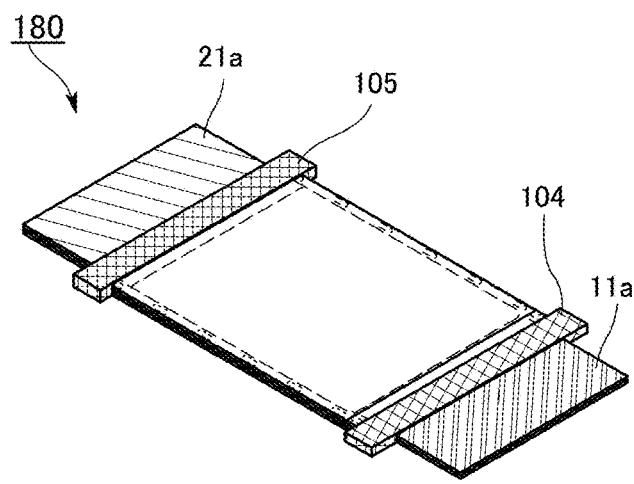

The electrode plates (111, 120, and 121) each provided with the fusing tape 50 are stacked as shown in FIG. 13A. Here, the fusing tape 50 is attached to both surfaces of each of the electrode plates (111 and 120) on the top side. The negative electrode plates (120 and 121) and the positive electrode plates (111) are stacked by turns so that the tabs 11a overlap with each other and the tabs 21a overlap with each other. In this manner, the electrode stack 180 (FIG. 13B) is formed. In the electrode stack 180, the fusing tapes 50 attached to the tabs 11a are fused to form the sealing structure 104, and the fusing tapes 50 attached to the tabs 21a are fused to form the sealing structure 105.

Figure 14:
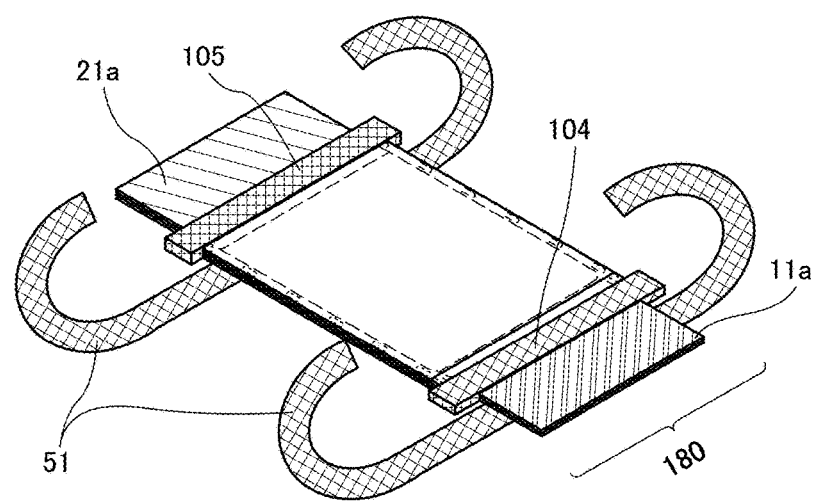
FIG. 14 shows a structural example of a power storage unit and a manufacturing example thereof.

As shown in FIG. 14, a fusing tape 51 may be further attached to each of the sealing structures 104 and 105. The fusing tapes 51 become part of the sealing structures 104 and 105. The fusing tape 51 can be attached to any one of the sealing structures 104 and 105. As the fusing tapes 50 and 51, a tape including a bonding portion formed using a material which has an insulating property and a water-resistance property, such as synthetic rubber, may be used.

A component that forms the sealing structures 104 and 105 is not limited to the fusing tape 50; it is appropriate to use a component, a material, or the like which is formed using an insulator and with which the sealing structures 104 and 105 can be formed so as to fill a space between two adjacent current collectors (tabs) and a space between the current collector (tab) and the exterior body, in order to prevent the electrolyte solution from leaking. For example, a sealing material having an insulating property can be used. In the case of using a component having fluidity such as a sealing material, the component may be applied to the electrode plate in advance or can be applied to the electrode plate while the electrode plates are stacked.

<Exterior Body>

The electrode stack 180 is sealed in the exterior body 107. In this sealing step, the exterior body 107 is formed so that the tabs 11a and 21a are exposed to the outside of the exterior body 107. Here, one film 70 is folded and formed into a bag-like shape, whereby the exterior body 107 is formed (FIGS. 15A to 15C and FIGS. 16A and 16B). As the film 70 for forming the exterior body 107, a single-layer film selected from a metal film (e.g., an aluminum film, a stainless steel film, and a nickel steel film), a plastic film made of an organic material, a hybrid material film including an organic material (e.g., an organic resin or fiber) and an inorganic material (e.g., ceramic), and a carbon-containing film (e.g., a carbon film or a graphite film) can be used. Alternatively, a stacked-layer film including two or more of the above films can be used as the film 70. As the film 70, a film provided with a depression and/or a projection may be used, which increases the film surface area of the film 70 and accordingly increases an effect of releasing heat from the exterior body 107. The depression and/or the projection can be formed by embossing, for example.

In the case where the power storage unit 300 is changed in shape, bending stress is applied to the exterior body 107. This might cause deformation such as a crease in a part of the exterior body 107, or cause damage to a part of the exterior body 107. When the depression and/or projection is formed on the surface of the exterior body 107, a strain due to stress generated in the exterior body 107 can be relieved.

Therefore, the power storage unit 300 can have high reliability. A "strain" is the scale of change in form indicating the displacement of a point of an object relative to the reference (initial) length of the object.

Figure 15A:
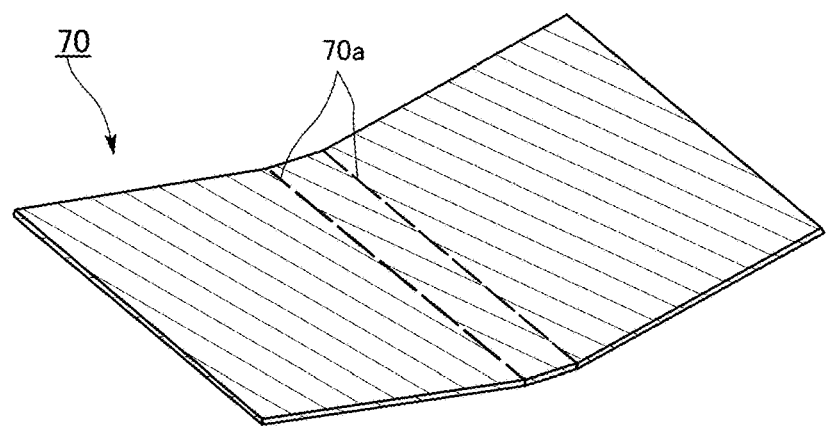
FIGS. 15A to 15C show a structural example of a power storage unit and a manufacturing example thereof.
Figure 15B:
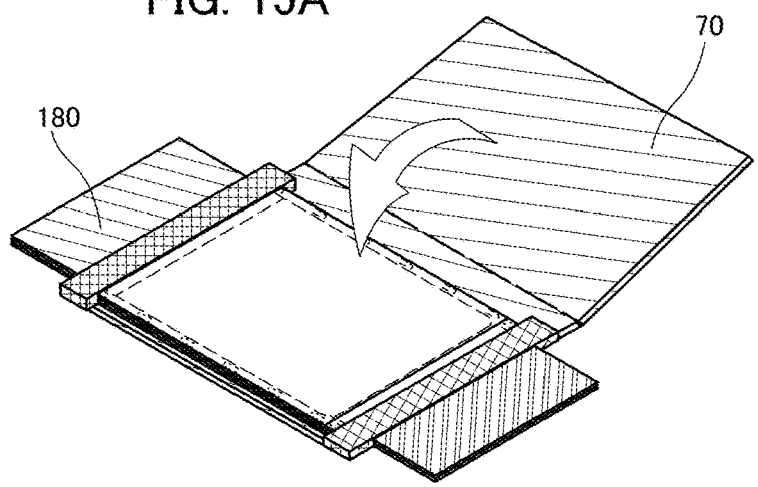
Figure 15C:
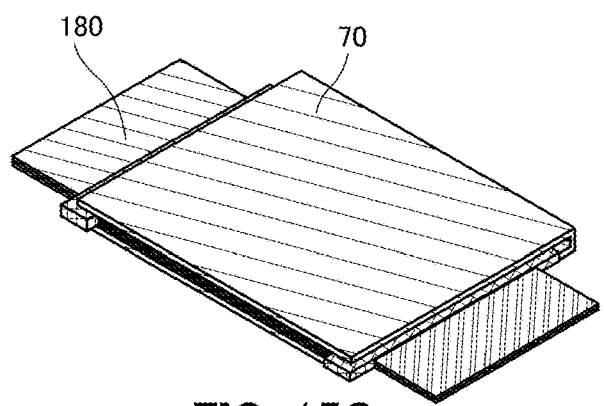
Figure 16A:
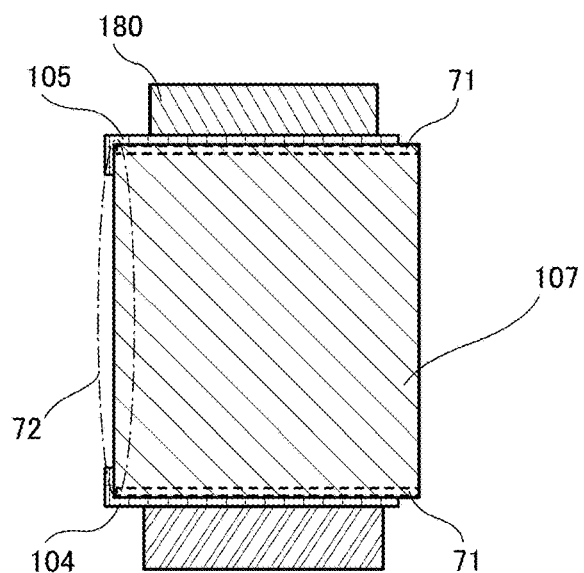
FIGS. 16A and 16B show structural examples of a power storage unit and manufacturing examples thereof.

The exterior body 107 is formed in the following manner. The film 70 is folded or a depression (a projection) is formed to fit the outside shape of the electrode stack 180. Here, folds 70a are formed in the film 70 as shown in FIG. 15A. Then, the electrode stack 180 is provided over the film 70 (FIG. 15B), and the film is folded along the folds 70a (FIG. 15C). For example, outer facing edges of the film 70 are bonded to each other by thermocompression or the like to form the exterior body 107. In this step, the bonding portion 71 of the film 70 is formed so that an introduction port 72 of the electrolyte solution 103 is left open (FIG. 16A). In this step, the film 70 is bonded to the sealing structures 104 and 105; thus, the electrode stack 180 is fixed to the film 70 (the exterior body 107).

Figure 16B:
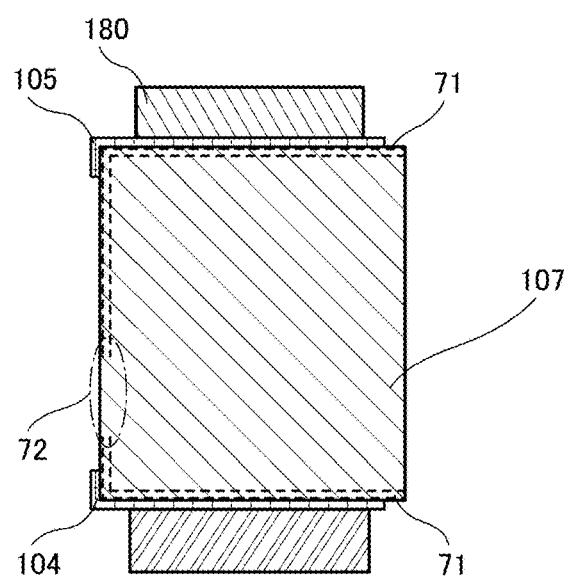

FIG. 16A shows a manufacturing example in which the bonding portion 71 is formed in two positions, i.e., an upper portion and a lower portion, around the exterior body 107 whereas the left side surface of the exterior body 107 is left open to serve as the introduction port 72. In the case where the power storage unit 300 has a large size, for example, the introduction port 72 can be formed in a part of the left side surface of the exterior body 107 as shown in FIG. 16B.

<Terminal portion>

The tabs 11a exposed to the outside of the exterior body 107 are electrically connected to each other, and the tabs 11b exposed to the outside of the exterior body 107 are electrically connected to each other. Thus, the terminal portion 101a of the positive electrode 101 and the terminal portion 102a of the negative electrode 102 are formed (FIG. 1, FIG. 3, and the like). The tabs may be electrically connected to each other by ultrasonic welding. The terminal portion 101a and the terminal portion 102a can be formed before the electrode stack 180 is sealed in the exterior body 107.

In the example shown in FIG. 3, in order to form the terminal portion 101a of the positive electrode 101, the tab 11a (the positive electrode current collectors 11) of the positive electrode plate 111 which is on the leftmost side is used as an alignment reference. The tab 11a is not bent and the other two tabs 11a are bent in the left direction, and the three tabs 11a are bonded to each other. Thus, the terminal portion 101a is formed. The terminal portion 102a of the negative electrode 102 is formed in a similar manner. That is, the tab 21a (the negative electrode current collector 21) of the negative electrode plate 120 which is on the leftmost side is not bent and the other three tabs 21a are bent in the left direction, and the four tabs 21a are bonded to each other. In this example, the two tabs 11a on the right side each include a curved portion having an approximately S-shape, an approximately arc-shape, or a bow-shape from a fixing portion of the sealing structure 104 to a bonding portion of the tabs 11a. Furthermore, the three tabs 21a on the right side each include a curved portion having an approximately S-shape, an approximately arc-shape, or a bow-shape from a bonding portion of the tabs 21a to a fixing portion of the sealing structure 105. It is needless to say that the curved shapes of the tabs 11a and 21a are not limited to the example shown in FIG. 3.

Figures 20A, 20B, 20C:
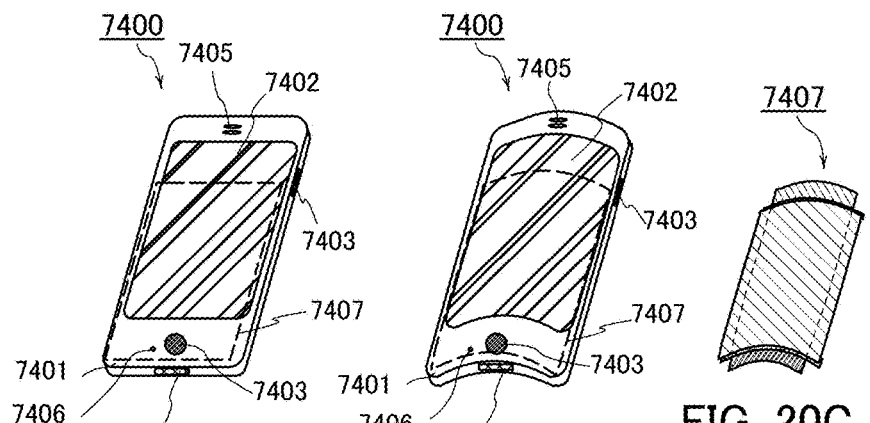
FIGS. 20A to 20G show structural examples of electronic devices.
Figures 20D, 20E:
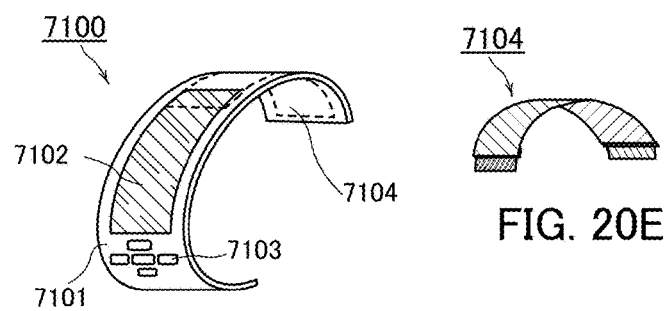

Bonding of the tabs 11a and bonding of the tabs 21a are performed so that the curved portions are formed as described above; thus, the power storage unit 300 which is less likely to break down by bending can be obtained. In particular, a structure strong against change in the shape of the exterior body 107 which makes the curved portions of the tabs 11a and 21a expanded is obtained. The structure is particularly strong against change in the shape of the exterior body 107 which makes the exterior body 107 bent or warped so that a flat surface on the right side of the exterior body 107 is projected in the method illustrated in FIG. 3 (so that the upper side is projected in the method illustrated in FIG. 2). Therefore, the power storage unit 300 is suitable for a power storage unit of an electronic device which is bendable in one direction, such as a power storage unit 7407 (FIG. 20C). Furthermore, the power storage unit 300 is suitable for a power storage unit which is incorporated in a housing with the power storage unit bent or warped, such as a power storage unit 7104 (FIG. 20E). That is, the power storage unit 300 is suitable for a power storage unit of a bent electronic device.

<Electrolyte Solution>

The electrolyte solution 103 is injected to the inside of the exterior body 107 through the introduction port 72 in a reduced-pressure atmosphere or in an inert atmosphere, and the separator 130 is soaked in the electrolyte solution 103.

As the electrolyte solution 103, an aprotic organic solvent is preferably used. For example, one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

When a gelled high-molecular material is used as the solvent for the electrolyte solution 103, safety against liquid leakage and the like is improved. Further, a secondary battery can be thinner and more lightweight. Typical examples of the gelled high-molecular material include a silicone gel, an acrylic gel, an acrylonitrile gel, polyethylene oxide, polypropylene oxide, a fluorine-based polymer, and the like.

Alternatively, the use of one or more ionic liquids (room temperature molten salts) which are less likely to burn and volatilize as the solvent of the electrolyte solution 103 can prevent the power storage unit from exploding or catching fire even when the power storage unit internally shorts out or the internal temperature increases due to overcharging or the like.

As an electrolyte dissolved in the above-described solvent, in the case of using lithium ions as carrier ions, one of lithium salts such as $LiPF_6$, $LiClO_4$, $LiAsF_6$, $LiBF_4$, $LiAlCl_4$, $LiSCN$, $LiBr$, $LiI$, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, and $LiN(C_2F_5SO_2)_2$ can be used, or two or more of these lithium salts can be used in an appropriate combination in an appropriate ratio.

The electrolyte solution 103 preferably contains a small amount of dust particles and elements other than the constituent elements of the electrolyte solution (hereinafter, also simply referred to as impurities) so as to be highly purified. Specifically, the weight ratio of impurities to the electrolyte solution is less than or equal to 1, preferably less than or equal to 0.1, and more preferably less than or equal to 0.01. An additive agent such as vinylene carbonate may be added to the electrolyte solution 103.

<Aging Step>

The introduction port 72 is temporarily sealed. Then, an aging step is performed so that the power storage unit 300 can be actually used. In the aging step, a set of charge and discharge is performed once or more than once, for example. When the power storage unit 300 is charged, part of the electrolyte solution 103 is decomposed and gas is generated in some cases. Therefore, after finishing the aging step, the sealed introduction port 72 (FIGS. 16A and 16B) is opened to release the gas generated in the exterior body 107.

<Completion of Power Storage Unit>

The electrolyte solution 103 may be supplied after the degassing. A set of the aging step and the degassing step may be performed twice or more than twice. By sealing the introduction port 72, the power storage unit 300 which can be actually used is completed (FIG. 1).

The power storage unit 300 which is strong against bending can be obtained by employing the structure in which the positive electrode plates and the negative electrode plates (111, 120, and 121) and the separators 130 are fixed to the exterior body 107 as shown in FIG. 1, FIG. 2, FIG. 3, FIG. 4 and FIG. 5. When the shape of the exterior body 107 is changed by bending or the like, the electrode plates (111, 120, and 121) and the separators 130 slide in the exterior body 107 in accordance with the change in shape, which relieves stress due to the change in the shape of the exterior body 107 which is applied to the electrode plates (111, 120, and 121). Furthermore, the current collectors (11 and 21) of the electrode plates (111, 120, and 121) are connected outside the exterior body 107. Inside the exterior body 107, the current collectors (11 and 21) are not fixed except for a portion fixed by the sealing structures 104 and 105. Therefore, the electrode plates (111, 120, and 121) are easily moved inside the exterior body 107, which further relieves stress applied to the electrode plates (111, 120, and 121) because of change in the shape of the exterior body 107. With the structure strong against change in shape, such as bending, improvement in the safety of the power storage unit 300 can be achieved.

Because the tab 11a of the positive electrode current collector 11 and the tab 21a of the negative electrode current collector 21 have no cut portion, they are less likely to break down than those in a power storage unit with a structure having a cut portion. This also contributes to improvement in strength of the structure of the power storage unit 300. Note that a cut portion can be provided in one or both of the tabs 11a and 21a. In the case where the cut portion is provided, the tabs 11a and 21a can be taken out from the same side surface of the exterior body 107. For example, in FIG. 1, the tab 11a may be taken out from the upper side surface of the exterior body 107 from which the tab 21a is taken out.

It is preferable to use a separator processed into a bag-like shape or an envelope-like shape such as the separators 130 and 131. In that case, even when the electrode plates (111, 120, and 121) are moved inside the exterior body 107, they are hardly shifted from the separators 130, which prevents a short circuit between the positive electrode 101 and the negative electrode 102 and accordingly improves the safety of the power storage unit 300.

<<Structural Example 2 of Power Storage Unit>>

Figure 17:
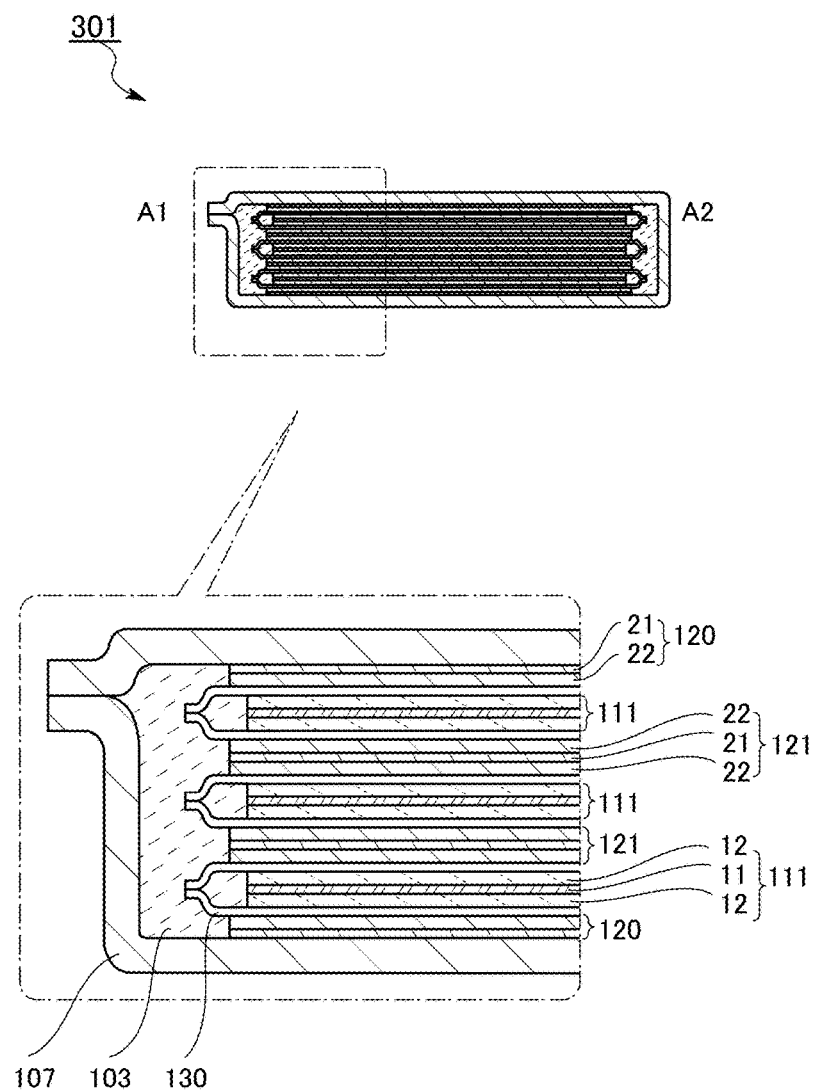
FIG. 17 shows a cross-sectional structure of a power storage unit.
Figure 18:
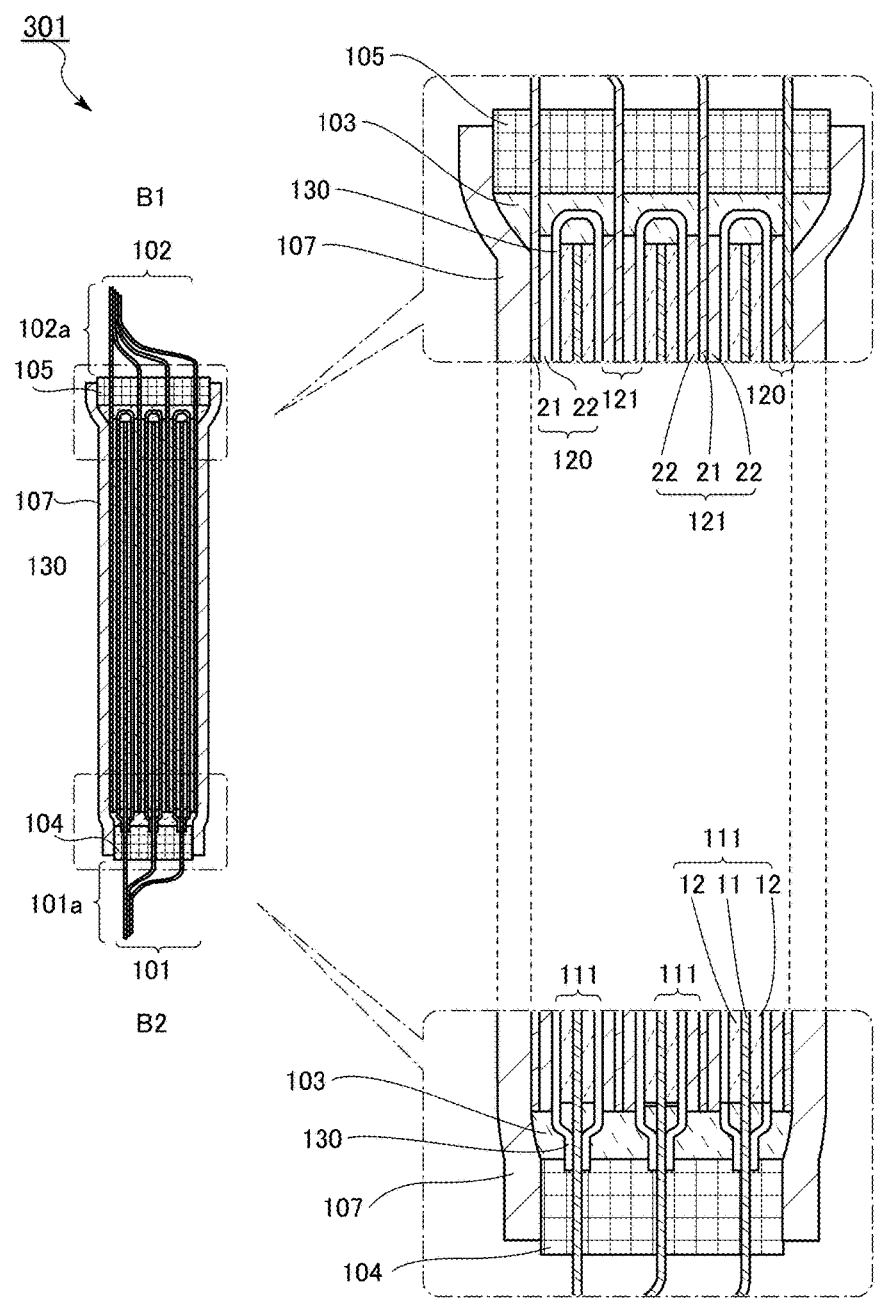
FIG. 18 shows a cross-sectional structure of a power storage unit.

In the structural example of the power storage unit shown in FIG. 1 and the like, each of the positive electrode plate and the negative electrode plate is covered with the separator. Alternatively, it is possible to use a structure in which one of the positive electrode plate and the negative electrode plate is covered with the separator whereas the other thereof is not covered with the separator. An example of such a structure is shown in FIG. 17 and FIG. 18. A power storage unit 301 shown in FIG. 17 and FIG. 18 is a modification example of the power storage unit 300. A plan view of the power storage unit 301 corresponds to FIG. 1. FIG. 17 and FIG. 18 are cross-sectional views showing a structural example of the power storage unit 301. The cross-sectional view shown in FIG. 17 is taken along the line A1-A2 in FIG. 1, and the cross-sectional view shown in FIG. 18 is taken along the line B1-B2 in FIG. 1.

In the power storage unit 301, each of the positive electrode plates 111 is covered with the separator 130, and the negative electrode plates (120 and 121) are not covered with the separator 130. It is possible to employ a structure in which the positive electrode plates 111 are not covered with the separator 130 and each of the negative electrode plates (120 and 121) is covered with the separator 130.

<<Structural Example 3 of Power Storage Unit>>

Figure 19:
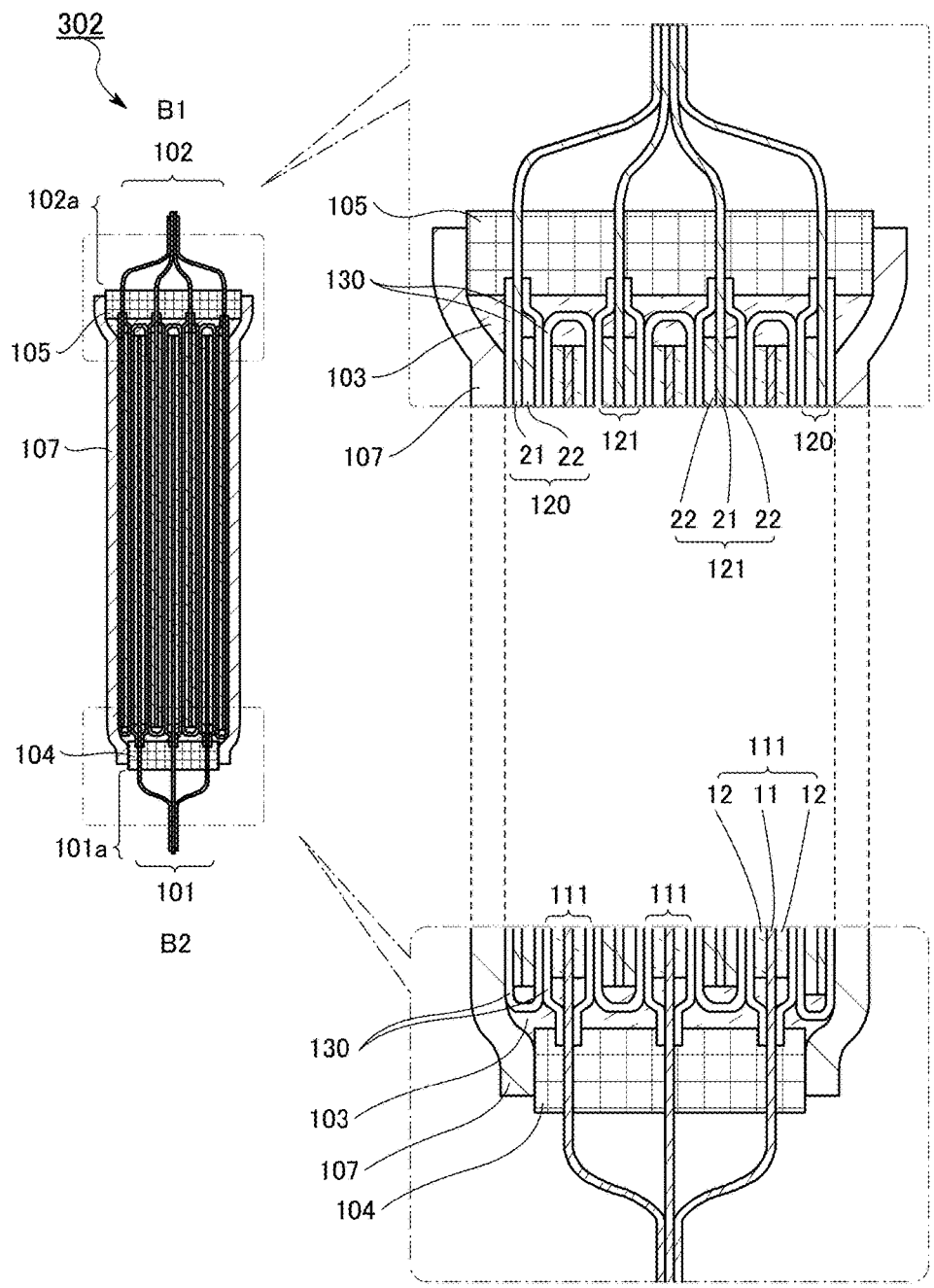
FIG. 19 shows a cross-sectional structure of a power storage unit.

FIG. 19 shows another structural example of the power storage unit. A power storage unit 302 shown in FIG. 19 is a modification example of the power storage unit 300 which is different from the power storage unit 300 (FIG. 3) in a structure of a terminal portion of each of the positive electrode and the negative electrode. A plan view of the power storage unit 302 corresponds to FIG. 1. FIG. 19 is a cross-sectional view showing a structural example of the power storage unit 302, and the cross-sectional view is taken along the line B1-B2 in FIG. 1.

As shown in FIG. 3, in the terminal portion 101a of the positive electrode 101 in the power storage unit 300, the tab 11a of the positive electrode current collector 11 on the leftmost side is used as an alignment reference. This tab 11a is not bent, whereas the other two tabs 11a are bent in the left direction, so that adjacent tabs 11a are contacted each other; in this state, the three tabs 11a are bonded to each other. Similarly, in the terminal portion 102a of the negative electrode 102, the tab 21a of the negative electrode current collector 21 on the leftmost side is used as an alignment reference. This tab 21a is not bent, whereas the other three tabs 21a are bent in the left direction, so that adjacent tabs 21a are contacted each other; in this state, the four tabs 21a are bonded to each other.

In the power storage unit 300, each of the terminal portion 101a and the terminal portion 102a has an asymmetric structure. The structure is extremely strong against change in the shape of the exterior body 107 which makes the right side curved and projected in FIG. 3. On the other hand, the structure is relatively weak against change in the shape of the exterior body 107 which makes the right side curved and depressed. In view of this, in the power storage unit 302 (FIG. 19), each of the terminal portion 101a and the terminal portion 102a has a highly symmetric structure. The terminal portion 101a and the terminal portion 102a having such a structure are similar in strength against both bending which makes the exterior body 107 depressed and bending which makes the exterior body 107 projected. Therefore, the power storage unit 302 is more suitable for a power storage unit of an electronic device which is bendable in two directions so that the exterior body 107 is projected and depressed, as compared to the power storage unit 300.

In the power storage unit 302 shown in FIG. 19, in order to form the terminal portions 101a and 102a, the electrode plate in the center of a plurality of electrode plates sealed in the exterior body 107 is used as an alignment reference, and the tabs (11a and 21a) of the other electrode plates are bent. Here, the positive electrode current collector 11 of the positive electrode plate 111 which is the second positive electrode plate from the right is used as an alignment reference. In the terminal portion 101a of the positive electrode 101, the central tab 11a is not bent, one tab 11a on the right side is bent in the left direction, and one tab 11a on the left side is bent in the right direction, so that adjacent tabs 11a are contacted each other; in this state, the three tabs 11a are bonded to each other. In the terminal portion 102a of the negative electrode 102, two tabs 21a on the right side are bent in the left direction and two tabs 21a on the left side are bent in the right direction, so that adjacent tabs 21a are contacted each other; in this state, the four tabs 21a are bonded to each other.

Embodiment 2

The power storage unit of one embodiment of the present invention can be used as a power source of various electronic devices which are driven by electric power. FIGS. 20A to 20G, FIGS. 21A to 21C, FIG. 22, and FIGS. 23A and 23B illustrate specific examples of the electronic devices using a power storage unit of one embodiment of the present invention.

Specific examples of the electronic devices using the power storage unit of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet information terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In addition, the power storage unit of one embodiment of the present invention can be incorporated along a curved inside/outside wall surface of a house or a building or a curved interior/exterior surface of a car.

FIG. 20A illustrates an example of a mobile phone (or a smartphone). A mobile phone 7400 includes a display portion 7402 incorporated in a housing 7401, an operation button 7403, an external connection port 7404, a speaker 7405, a microphone 7406, and the like. Note that the mobile phone 7400 includes the power storage unit 7407.

The mobile phone 7400 illustrated in FIG. 20B is bent. When the whole mobile phone 7400 is bent by the external force, the power storage unit 7407 included in the mobile phone 7400 is also bent. FIG. 20C illustrates the power storage unit 7407 in a state where the mobile phone 7400 is bent.

FIG. 20D illustrates an example of a bangle display device. A portable display device 7100 includes a housing 7101, a display portion 7102, an operation button 7103, and the power storage unit 7104. FIG. 20E shows the power storage unit 7104 which is incorporated in the housing 7101. As shown in FIG. 20E, the bent power storage unit 7104 is incorporated in the housing 7101.

Figures 20F, 20G:
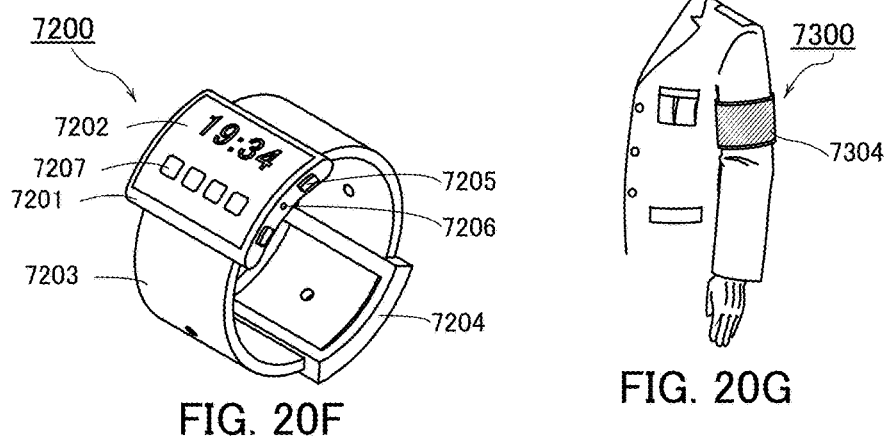

FIG. 20F illustrates an example of a wrist-watch-type portable information terminal. A portable information terminal 7200 includes a housing 7201, a display portion 7202, a band 7203, a buckle 7204, an operation button 7205, an input output terminal 7206, and the like. The portable information terminal 7200 is capable of executing a variety of applications such as mobile phone calls, e-mailing, viewing and editing texts, music reproduction, Internet communication, and a computer game.

The display surface of the display portion 7202 is bent, and images can be displayed along the bent display surface. Further, the display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as power ON/OFF, ON/OFF of wireless communication, setting and cancellation of manner mode, and setting and cancellation of power saving mode can be performed. For example, the functions of the operation button 7205 can be set freely by setting the operation system incorporated in the portable information terminal 7200.

Further, the portable information terminal 7200 can employ near field communication that is a communication method based on an existing communication standard. In that case, for example, mutual communication between the portable information terminal 7200 and a headset capable of wireless communication can be performed, and thus hands-free calling is possible.

Moreover, the portable information terminal 7200 includes the input output terminal 7206, and data can be directly transmitted to and received from another information terminal via a connector. Power charging through the input output terminal 7206 is possible. Note that the charging operation may be performed by wireless power feeding without using the input output terminal 7206.

The portable information terminal 7200 includes a power storage unit. For example, the power storage unit 7104 shown in FIG. 20E can be incorporated in the housing 7201 with a state where the power storage unit 7104 is bent or can be incorporated in the band 7203 with a state where the power storage unit 7104 can be bent.

FIG. 20G illustrates an example of an armband display device. A display device 7300 includes a display portion 7304 and a power storage unit like the power storage unit 7104 of one embodiment of the present invention. The display device 7300 can include a touch sensor in the display portion 7304 and can serve as a portable information terminal.

The display surface of the display portion 7304 is bent, and images can be displayed on the bent display surface. A display state of the display device 7300 can be changed by, for example, near field communication that is a communication method based on an existing communication standard.

The display device 7300 includes an input output terminal, and data can be directly transmitted to and received from another information terminal via a connector. Power charging through the input output terminal is possible. Note that the charging operation may be performed by wireless power feeding without using the input output terminal.

FIGS. 21A and 21B illustrate an example of a foldable tablet information terminal. FIGS. 21A and 21B illustrate a tablet information terminal 9600 opened and closed, respectively. The tablet information terminal 9600 includes a housing 9630 provided with a housing 9630a and a housing 9630b, a movable portion 9640 connecting the housings 9630a and 9630b, a display portion 9631 provided with a display portion 9631a and a display portion 9631b, a display mode switch 9626, a power switch 9627, a power saver switch 9625, a fastener 9629, an operation switch 9628, and the like.

The tablet information terminal 9600 includes a power storage unit 9635 inside the housings 9630a and 9630b. The power storage unit 9635 is provided across the housings 9630a and 9630b, passing through the movable portion 9640.

Part of the display portion 9631a can be a touch panel region 9632a and data can be input when a displayed operation key 9638 is touched. FIG. 21A shows, but is not limited to, a structure in which a half region in the display portion 9631a has only a display function and the other half region has a touch panel function. The whole area of the display portion 9631a may have a touch panel function. For example, the whole area of the display portion 9631a can display keyboard buttons and serve as a touch panel while the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard button 9641 can be displayed on the display portion 9632b. Touch input can be performed in the touch panel region 9632a and the touch panel region 9632b at the same time.

The display mode switch 9626 can switch the display between portrait mode, landscape mode, and the like, and between monochrome display and color display, for example. The power saver switch 9625 can control display luminance in accordance with the amount of external light in use of the tablet information terminal 9600, which is measured with an optical sensor incorporated in the tablet information terminal 9600. The tablet information terminal may include another detection device such as a gyroscope or an acceleration sensor in addition to the optical sensor.

Although FIG. 21A illustrates an example in which the display portions 9631a and 9631b have the same display area, the display portions 9631a and 9631b may have different display areas and different display quality. For example, higher-resolution images may be displayed on one of the display portions 9631a and 9631b.

The tablet information terminal is closed in FIG. 21B. The tablet information terminal includes the housing 9630, a solar cell 9633, and a charge and discharge control circuit 9634 including a DC-DC converter 9636. The power storage unit of one embodiment of the present invention is used as the power storage unit 9635.

The tablet information terminal 9600 can be folded in two so that the housings 9630a and 9630b overlap with each other when not in use. Thus, the display portions 9631a and 9631b can be protected, which increases the durability of the tablet information terminal 9600. In addition, the power storage unit 9635 of one embodiment of the present invention has flexibility and can be repeatedly bent without a large decrease in charge and discharge capacity. Thus, a highly reliable tablet information terminal can be provided.

The tablet information terminal 9600 can also have a function of displaying various kinds of data (e.g., a still image, a moving image, and a text image), a function of displaying a calendar, a date, or the time on the display portion, a touch-input function of operating or editing data displayed on the display portion by touch input, a function of controlling processing by various kinds of software (programs), and the like.

The solar cell 9633, which is attached on the surface of the tablet information terminal 9600, supplies electric power to a touch panel, a display portion, an image signal processor, and the like. Note that the solar cell 9633 is preferable because the solar cell 9633 can be provided on one or both surfaces of the housing 9630 and the power storage unit 9635 can be charged efficiently. The use of a lithium-ion battery as the power storage unit 9635 brings an advantage such as a reduction in size.

FIG. 21C is a block diagram showing an example of a structure of the charge and discharge control circuit 9634. The charge and discharge control circuit 9634 includes the power storage unit 9635, the DC-DC converter 9636, a converter 9637, the switches SW1, SW2, and SW3, and the like.

An example of the operation of the charge and discharge control circuit 9634 when the solar cell 9633 is in a power generation state is described. The voltage of electric power generated by the solar cell 9633 is raised or lowered by the DCDC converter 9636 to a voltage for charging the power storage unit 9635. Then, when the electric power from the solar cell 9633 is used for the operation of the display portion 9631, the switch SW1 is turned on and the voltage of the electric power is raised or lowered by the converter 9637 to a voltage needed for the display portion 9631. When display on the display portion 9631 is not performed, the switch SW1 is turned off and the switch SW2 is turned on, so that the power storage unit 9635 can be charged.

Note that the solar cell 9633 is described as an example of a power generation means; however, one embodiment of the present invention is not limited to this example. The power storage unit 9635 may be charged using another power generation means such as a piezoelectric element or a thermoelectric conversion element (Peltier element). For example, the power storage unit 9635 may be charged using a non-contact power transmission module that transmits and receives electric power wirelessly (without contact) or using another charging means in combination.

Figure 22:
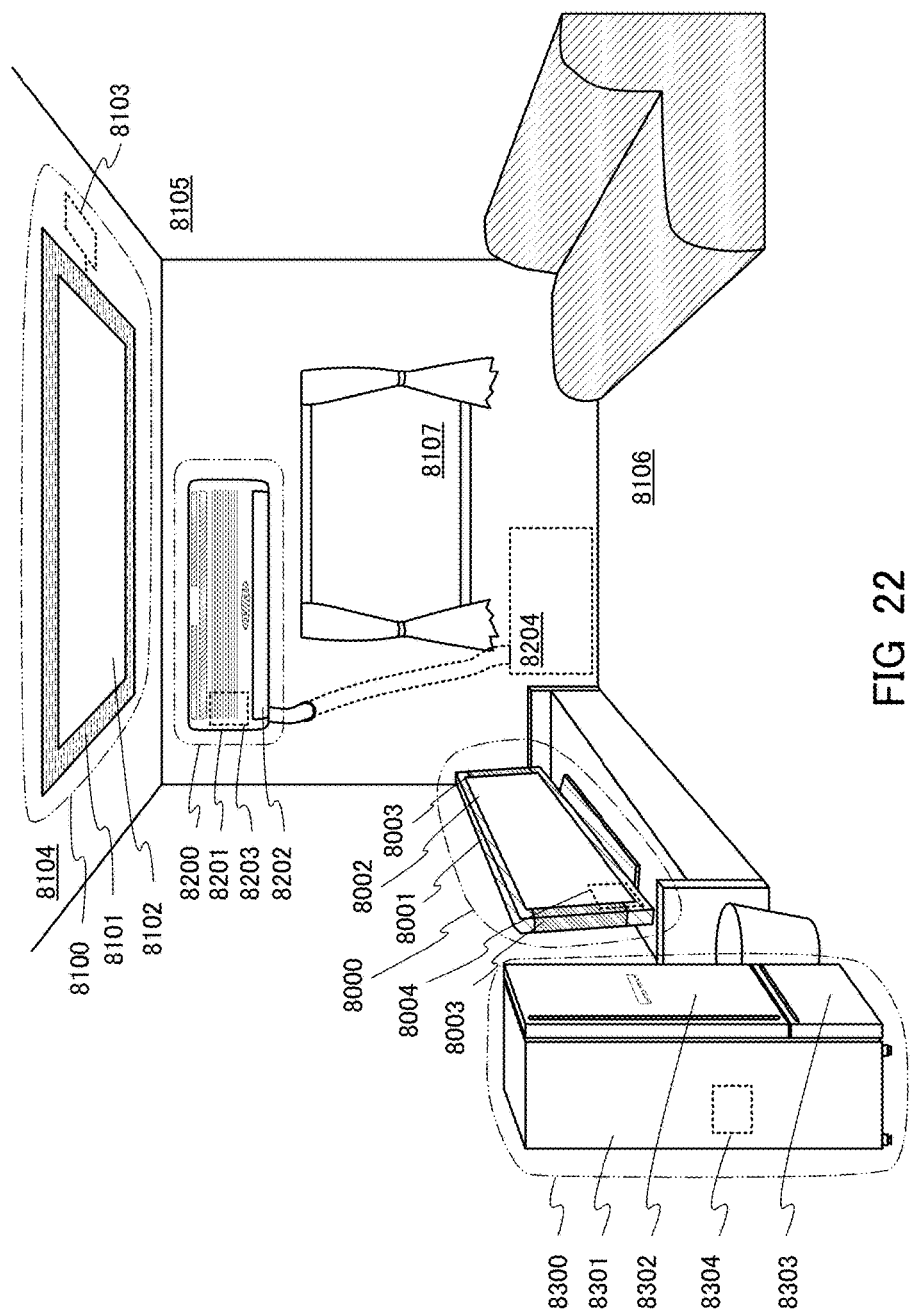
FIG. 22 shows structural examples of electronic devices.

FIG. 22 illustrates examples of other electronic devices.

A display device 8000 is an example of an electronic device including a power storage unit 8004 of one embodiment of the present invention. Specifically, the display device 8000 corresponds to a display device for TV broadcast reception and includes a housing 8001, a display portion 8002, speaker portions 8003, the power storage unit 8004, and the like. The power storage unit 8004 of one embodiment of the present invention is provided in the housing 8001. The display device 8000 can receive electric power from a commercial power source or use electric power stored in the power storage unit 8004. Thus, the display device 8000 can be operated with the use of the power storage unit 8004 of one embodiment of the present invention as an uninterruptible power supply even when electric power cannot be supplied from a commercial power supply due to power failure or the like.

A display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used for the display portion 8002.

Note that the display device includes, in its category, all information display devices for personal computers, advertisement displays, and the like besides the ones for TV broadcast reception.

An installation lighting device 8100 is an example of an electronic device including a power storage unit 8103 of one embodiment of the present invention. Specifically, the lighting device 8100 includes a housing 8101, a light source 8102, the power storage unit 8103, and the like. Although FIG. 22 illustrates the case where the power storage unit 8103 is provided in a ceiling 8104 on which the housing 8101 and the light source 8102 are installed, the power storage unit 8103 may be provided in the housing 8101. The lighting device 8100 can receive electric power from a commercial power supply or use electric power stored in the power storage unit 8103. Thus, the lighting device 8100 can be operated with the use of the power storage unit 8103 as an uninterruptible power supply even when power cannot be supplied from a commercial power supply because of power failure or the like.

Although the installation lighting device 8100 provided in the ceiling 8104 is illustrated in FIG. 22 as an example, the power storage unit of one embodiment of the present invention can be used in an installation lighting device provided in, for example, a wall 8105, a floor 8106, a window 8107, or the like besides the ceiling 8104. Alternatively, the power storage unit can be used in a tabletop lighting device or the like. As the light source 8102, an artificial light source which emits light artificially by using electric power can be used. Examples of the artificial light source include discharge lamps such as an incandescent lamp and a fluorescent lamp, and light-emitting elements such as an LED and an organic EL element.

An air conditioner including an indoor unit 8200 and an outdoor unit 8204 is an example of an electronic device including a power storage unit 8203 of one embodiment of the present invention. Specifically, the indoor unit 8200 includes a housing 8201, an air outlet 8202, the power storage unit 8203, and the like. Although FIG. 22 illustrates the case where the power storage unit 8203 is provided in the indoor unit 8200, the power storage unit 8203 may be provided in the outdoor unit 8204. Alternatively, the power storage unit 8203 may be provided in both the indoor unit 8200 and the outdoor unit 8204. The air conditioner can receive electric power from a commercial power source or use electric power stored in the power storage unit 8203. Particularly in the case where the power storage unit 8203 is provided in both the indoor unit 8200 and the outdoor unit 8204, the air conditioner can operate with the use of the power storage unit 8203 of one embodiment of the present invention as an uninterruptible power source even when electric power cannot be supplied from a commercial power source because of power failure or the like.

Note that although the split-type air conditioner including the indoor unit and the outdoor unit is illustrated in FIG. 22 as an example, a power storage unit of one embodiment of the present invention can be used in an air conditioner in which the functions of an indoor unit and an outdoor unit are integrated in one housing.

An electric refrigerator-freezer 8300 is an example of an electronic device including a power storage unit 8304 of one embodiment of the present invention. Specifically, the electric refrigerator-freezer 8300 includes a housing 8301, a door for a refrigerator 8302, a door for a freezer 8303, the power storage unit 8304, and the like. The power storage unit 8304 is provided in the housing 8301. The electric refrigerator-freezer 8300 can receive electric power from a commercial power source or use electric power stored in the power storage unit 8304. Thus, the electric refrigerator-freezer 8300 can operate with the use of the power storage unit 8304 of one embodiment of the present invention as an uninterruptible power source even when electric power cannot be supplied from a commercial power source because of power failure or the like.

Note that among the electronic devices described above, a high-frequency heating apparatus such as a microwave oven and an electronic device such as an electric rice cooker require high power in a short time. The tripping of a breaker of a commercial power supply in use of an electronic device can be prevented by using the power storage unit of one embodiment of the present invention as an auxiliary power supply for supplying electric power which cannot be supplied enough by a commercial power supply.

In addition, in a time period when electronic devices are not used, specifically when the proportion of the amount of electric power which is actually used to the total amount of electric power which can be supplied from a commercial power source (such a proportion is referred to as power usage rate) is low, electric power can be stored in the power storage unit, whereby the power usage rate can be reduced in a time period when the electronic devices are used. For example, in the case of the electric refrigerator-freezer 8300, electric power can be stored in the power storage unit 8304 in night time when the temperature is low and the door for a refrigerator 8302 and the door for a freezer 8303 are not often opened or closed. On the other hand, in daytime when the temperature is high and the door for a refrigerator 8302 and the door for a freezer 8303 are frequently opened and closed, the power storage unit 8304 is used as an auxiliary power source; thus, the power usage rate in daytime can be reduced.

Figure 23A:
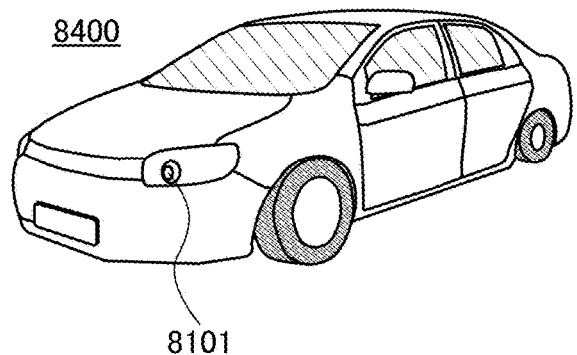
FIGS. 23A and 23B show structural examples of electronic devices.
Figure 23B:
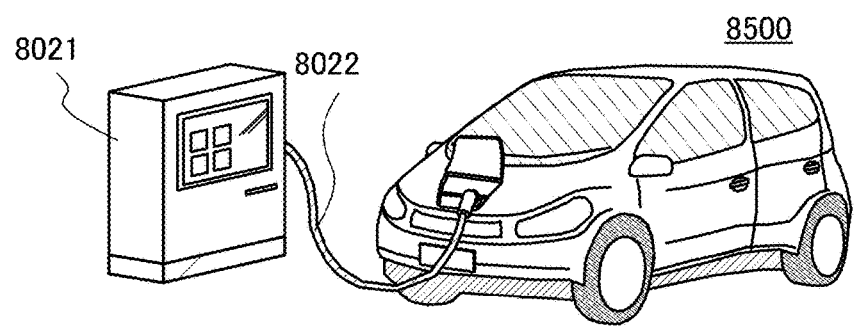

The power storage unit of one embodiment of the present invention can be used for power sources of a variety of electric motors. FIGS. 23A and 23B illustrate examples of an electronic device including an electric motor and a power storage unit. The use of a power storage unit in vehicles can lead to next-generation clean energy vehicles such as hybrid electric vehicles (HEVs), electric vehicles (EVs), and plug-in hybrid electric vehicles (PHEVs).

An automobile 8400 illustrated in FIG. 23A is an electric vehicle which runs on the power of the electric motor. Alternatively, the automobile 8400 is a hybrid electric vehicle capable of driving using either the electric motor or the engine as appropriate. The power storage unit incorporated in the automobile 8400 is used not only for driving the electric motor, but also for supplying electric power to a light-emitting device such as a headlight 8401 or a room light (not illustrated). The power storage unit can also supply electric power to a display device included in the automobile 8400, such as a speedometer or a tachometer. Furthermore, the power storage unit can supply electric power to a semiconductor device included in the automobile 8400, such as a navigation system.

FIG. 23B illustrates an automobile 8500 including a power storage unit. The automobile 8500 can be charged when the power storage unit is supplied with electric power through external charging equipment by a plug-in system, a contactless power supply system, or the like. In FIG. 23B, the power storage unit included in the automobile 8500 is charged with the use of a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. For example, with the use of a plug-in technique, a power storage unit included in the automobile 8500 can be charged by being supplied with electric power from outside. The charging can be performed by converting AC electric power into DC electric power through a converter such as an AC-DC converter.

Although not illustrated, the vehicle may include a power receiving device so as to be charged by being supplied with electric power from an above-ground power transmitting device in a contactless manner. In the case of the contactless power supply system, by fitting the power transmitting device in a road or an exterior wall, charging can be performed not only when the automobile stops but also when moves. In addition, the contactless power supply system may be utilized to perform transmission/reception between vehicles. Furthermore, a solar cell may be provided in the exterior of the automobile to charge the power storage unit when the automobile stops or moves. To supply electric power in such a contactless manner, an electromagnetic induction method or a magnetic resonance method can be used.

According to one embodiment of the present invention, the power storage unit can have improved cycle characteristics and reliability. Furthermore, according to one embodiment of the present invention, the power storage unit itself can be made more compact and lightweight as a result of improved characteristics of the power storage unit. The compact and lightweight power storage unit contributes to a reduction in the weight of a vehicle, and thus increases the driving distance. Moreover, the power storage unit included in the vehicle can be used as a power source for supplying electric power to products other than the vehicle. In that case, the use of a commercial power supply can be avoided at peak time of electric power demand.

REFERENCE NUMERALS

11: positive electrode current collector, 11a: tab (portion), 11b: tab (portion), 12: positive electrode active material layer, 21: negative electrode current collector, 21a: tab (portion), 21b: tab (portion), 22: negative electrode active material layer, 30: sheet, 30a: fold, 31: bonding portion, 32: bonding portion, 33: bonding portion, 35: opening, 50: fusing tape, 51: fusing tape, 70: film, 70a: fold, 71: bonding portion, 72: introduction port, 101: positive electrode, 101a: terminal portion (portion), 102: negative electrode, 102a: terminal portion (portion), 103: electrolyte solution, 104: sealing structure, 105: sealing structure, 107: exterior body, 107: sealing structure, 110: positive electrode plate, 111: positive electrode plate, 112: positive electrode plate, 120: negative electrode plate, 121: negative electrode plate, 122: negative electrode plate, 130: separator, 131: separator, 180: electrode stack, 300: power storage unit, 301: power storage unit, 302: power storage unit, 7100: portable display device, 7101: housing, 7102: display portion, 7103: operation button, 7104: power storage unit, 7200: portable information terminal, 7201: housing, 7202: display portion, 7203: band, 7204: buckle, 7205: operation button, 7206: input output terminal, 7207: icon, 7300: display device, 7304: display portion, 7400: mobile phone, 7401: housing, 7402: display portion, 7403: operation button, 7404: external connection port, 7405: speaker, 7406: microphone, 7407: power storage unit, 8000: display device, 8001: housing, 8002: display portion, 8003: speaker portion, 8004: power storage unit, 8021: charging apparatus, 8022: cable, 8100: lighting device, 8101: housing, 8102: light source, 8103: power storage unit, 8104: ceiling, 8105: wall, 8106: floor, 8107: window, 8200: indoor unit, 8201: housing, 8202: air outlet, 8203: power storage unit, 8204: outdoor unit, 8300: electric refrigerator-freezer, 8301: housing, 8302: door for refrigerator, 8303: door for freezer, 8304: power storage unit, 8400: automobile, 8401: headlight, 8500: automobile, 9600: tablet information terminal, 9625: switch, 9626: switch, 9627: power switch, 9628: operation switch, 9629: fastener, 9630: housing, 9630a: housing, 9630b: housing, 9631: display portion, 9631a: display portion, 9631b: display portion, 9632a: region, 9632b: region, 9633: solar cell, 9634: charge and discharge control circuit, 9635: power storage unit, 9636: DC-DC converter, 9637: converter, 9638: operation key, 9639: button, 9640: movable portion.

This application is based on Japanese Patent Application serial no. 2013-246468 filed with Japan Patent Office on Nov. 28, 2013, the entire contents of which are hereby incorporated by reference.

The invention claimed is:

1. A power storage unit comprising:
   a first electrode plate;
   a first insulating sheet, wherein the first electrode plate is covered with the first insulating sheet folded in two;
   a second electrode plate adjacent to the first electrode plate with a first part of the first insulating sheet placed therebetween;
   an exterior body covering the first electrode plate, the first insulating sheet, and the second electrode plate;
   a first sealing material sealing a first edge of the exterior body; and
   a second sealing material sealing a second edge of the exterior body, the second edge of the exterior body facing the first edge of the exterior body,
   wherein a part of the first electrode plate and edges of the first insulating sheet are covered by the first sealing material,
   wherein a part of the second electrode plate is covered by the second sealing material, and
   wherein the first electrode plate and the first insulating sheet slide together in the exterior body when the exterior body is bent.

2. The power storage unit according to claim 1, wherein the first insulating sheet has an envelope-like shape.

3. The power storage unit according to claim 1, wherein the first insulating sheet comprises a material selected from the group consisting of polypropylene, polyethylene, polybutene, nylon, polyester, polysulfone, polyacrylonitrile, polyvinylidene fluoride, tetrafluoroethylene, glass fiber, high-molecular fiber, and cellulose.

4. The power storage unit according to claim 1, wherein the second electrode plate is fixed to the second edge of the exterior body by the second sealing material.

5. The power storage unit according to claim 4, further comprising a second insulating sheet,
wherein the second electrode plate is covered with the second insulating sheet folded in two, and
wherein the part of the second electrode plate and edges of the second insulating sheet are covered by the second sealing material.

6. The power storage unit according to claim 5, wherein the second insulating sheet has an envelope-like shape.

7. The power storage unit according to claim 1, wherein terminal portions of the first electrode plate and the second electrode plate are provided outside the exterior body.

8. The power storage unit according to claim 1,
wherein plural first electrode plates are provided in the exterior body and connected to each other at a first portion provided outside the exterior body and the first sealing material, and
wherein plural second electrode plates are provided in the exterior body and connected to each other at a second portion provided outside the exterior body and the second sealing material.

9. The power storage unit according to claim 1, wherein the exterior body comprises an embossed film.

10. An electronic device comprising the power storage unit according to claim 1.

11. A power storage unit comprising:
a first electrode plate;
a pair of first insulating sheets, wherein the first electrode plate is interposed between the pair of first insulating sheets;
a second electrode plate adjacent to the first electrode plate with one of the pair of first insulating sheets placed therebetween;
an exterior body covering the first electrode plate, the pair of first insulating sheets, and the second electrode plate;
a first sealing material sealing a first edge of the exterior body; and
a second sealing material sealing a second edge of the exterior body, the second edge of the exterior body facing the first edge of the exterior body,
wherein a part of the first electrode plate and edges of the pair of first insulating sheets are covered by the first sealing material,
wherein a part of the second electrode plate is covered by the second sealing material, and
wherein the first electrode plate and the pair of first insulating sheets slide together in the exterior body when the exterior body is bent.

12. The power storage unit according to claim 11, wherein parts of the pair of first insulating sheets are bonded so as to have an envelope-like shape.

13. The power storage unit according to claim 11, wherein the pair of first insulating sheets comprise a material selected from the group consisting of polypropylene, polyethylene, polybutene, nylon, polyester, polysulfone, polyacrylonitrile, polyvinylidene fluoride, tetrafluoroethylene, glass fiber, high-molecular fiber, and cellulose.

14. The power storage unit according to claim 11, wherein the second electrode plate is fixed to the second edge of the exterior body by the second sealing material.

15. The power storage unit according to claim 11, further comprising a pair of second insulating sheets, wherein the second electrode plate is placed between the pair of second insulating sheets.

16. The power storage unit according to claim 15, wherein parts of the pair of second insulating sheets are bonded so as to have an envelope-like shape.

17. The power storage unit according to claim 11, wherein terminal portions of the first electrode plate and the second electrode plate are provided outside the exterior body.

18. The power storage unit according to claim 11,
wherein plural first electrode plates are provided in the exterior body and connected to each other at a first portion provided outside the exterior body and the first sealing material, and
wherein plural second electrode plates are provided in the exterior body and connected to each other at a second portion provided outside the exterior body and the second sealing material.

19. The power storage unit according to claim 11, wherein the exterior body comprises an embossed film.

20. An electronic device comprising the power storage unit according to claim 11.

21. A power storage unit comprising:
a first electrode plate;
a first insulating sheet, wherein a first surface and a second surface of the first electrode plate are covered with the first insulating sheet;
a second electrode plate adjacent to the first electrode plate with a first part of the first insulating sheet placed therebetween;
an exterior body covering the first electrode plate, the first insulating sheet, and the second electrode plate;
a first sealing material covering a part of the first electrode plate and edges of the first insulating sheet and sealing a first edge of the exterior body; and
a second sealing material covering a part of the second electrode plate and sealing a second edge of the exterior body, the second edge of the exterior body facing the first edge of the exterior body,
wherein the first electrode plate and the first insulating sheet slide together in the exterior body when the exterior body is bent.

22. The power storage unit according to claim 21, wherein the first insulating sheet comprises a material selected from the group consisting of polypropylene, polyethylene, polybutene, nylon, polyester, polysulfone, polyacrylonitrile, polyvinylidene fluoride, tetrafluoroethylene, glass fiber, high-molecular fiber, and cellulose.

23. The power storage unit according to claim 21, wherein the second electrode plate is fixed to the second edge of the exterior body by the second sealing material.

24. The power storage unit according to claim 21, further comprising a second insulating sheet, wherein a first surface and a second surface of the second electrode plate are covered with the second insulating sheet.

25. The power storage unit according to claim 21, wherein terminal portions of the first electrode plate and the second electrode plate are provided outside the exterior body.

26. The power storage unit according to claim 21, wherein the exterior body comprises an embossed film.

27. An electronic device comprising the power storage unit according to claim 21.

28. The power storage unit according to claim 1, wherein the first sealing material fills a space between the first edge of the exterior body with the first electrode plate and the edges of the first insulating sheet.

29. The power storage unit according to claim 11, wherein the first sealing material fills a space between the first edge of the exterior body with the first electrode plate and the edges of the pair of first insulating sheets.

30. The power storage unit according to claim 21, wherein the first sealing material fills a space between the first edge of the exterior body with the first electrode plate and the edges of the first insulating sheet.

\* \* \* \* \*